US010229974B2

(12) United States Patent
Matsumura et al.

(10) Patent No.: US 10,229,974 B2
(45) Date of Patent: Mar. 12, 2019

(54) SEMICONDUCTOR DEVICE AND POWER CONVERSION DEVICE

(71) Applicant: HITACHI, LTD., Chiyoda-ku, Tokyo (JP)

(72) Inventors: Mieko Matsumura, Tokyo (JP); Junichi Sakano, Tokyo (JP); Naoki Tega, Tokyo (JP); Yuki Mori, Tokyo (JP); Haruka Shimizu, Tokyo (JP); Keisuke Kobayashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/560,428

(22) PCT Filed: May 18, 2015

(86) PCT No.: PCT/JP2015/064222
§ 371 (c)(1),
(2) Date: Sep. 21, 2017

(87) PCT Pub. No.: WO2016/185544
PCT Pub. Date: Nov. 24, 2016

(65) Prior Publication Data
US 2018/0090574 A1 Mar. 29, 2018

(51) Int. Cl.
*H01L 29/16* (2006.01)
*H01L 29/73* (2006.01)
(Continued)

(52) U.S. Cl.
CPC ...... *H01L 29/1608* (2013.01); *H01L 29/0615* (2013.01); *H01L 29/0684* (2013.01);
(Continued)

(58) Field of Classification Search
CPC ............ H01L 29/0865; H01L 29/0615; H01L 29/1033; H01L 29/1608; H01L 29/7802;
(Continued)

(56) References Cited

U.S. PATENT DOCUMENTS 5,723,890 A  3/1998 Fujihira et al.
8,723,259 B2  5/2014 Nakao et al.
(Continued)

FOREIGN PATENT DOCUMENTS

JP  8-228002 A  9/1996
JP  2002-368215 A  12/2002
(Continued)

*Primary Examiner* — Caridad Everhart
(74) *Attorney, Agent, or Firm* — Miles & Stockbridge P.C.

(57) ABSTRACT

To solve a problem of realizing a large current and highly reliable power semiconductor device while shrinking a unit cell. A semiconductor device according to the present invention includes a plurality of p-type body regions extending in a first direction. The semiconductor device further includes: a JFET region formed to extend in the first direction between p-type body regions which are adjacent to each other in a second direction orthogonal to the first direction; an $n^+$-type source region formed to extend in the first direction within a p-type body region and separate from an end side surface of the p-type body; and a channel region formed to extend in the first direction and in a top layer portion of a p-type body region between an end side surface of the p-type body region and an end side surface of an $n^+$-type source region.

12 Claims, 30 Drawing Sheets

(51) Int. Cl.
  *H01L 29/739* (2006.01)
  *H01L 29/06* (2006.01)
  *H01L 29/08* (2006.01)
  *H01L 29/36* (2006.01)
  *H01L 29/10* (2006.01)
  *H01L 29/423* (2006.01)
  *H01L 29/78* (2006.01)
  *H01L 29/417* (2006.01)

(52) U.S. Cl.
  CPC ...... *H01L 29/0696* (2013.01); *H01L 29/0865* (2013.01); *H01L 29/0869* (2013.01); *H01L 29/1033* (2013.01); *H01L 29/1095* (2013.01); *H01L 29/36* (2013.01); *H01L 29/41741* (2013.01); *H01L 29/4238* (2013.01); *H01L 29/7395* (2013.01); *H01L 29/7802* (2013.01)

(58) Field of Classification Search
  CPC ............. H01L 29/1095; H01L 29/7395; H01L 29/4238; H01L 29/36; H01L 29/0869; H01L 29/0684; H01L 29/0696
  See application file for complete search history.

(56) References Cited

U.S. PATENT DOCUMENTS

| | | |
|---|---|---|
| 2003/0042549 A1 | 3/2003 | Fujihira et al. |
| 2009/0101974 A1 | 4/2009 | Saito et al. |
| 2009/0166731 A1 | 7/2009 | Maruoka |
| 2014/0246682 A1* | 9/2014 | Uchida ............... H01L 27/0629 257/77 |
| 2017/0125575 A1* | 5/2017 | Ohoka ................... H01L 21/28 |

FOREIGN PATENT DOCUMENTS

| | | |
|---|---|---|
| JP | 2009-105110 A | 5/2009 |
| JP | 2009-158717 A | 7/2009 |
| JP | 2013-239554 A | 11/2013 |
| JP | 2014-150279 A | 8/2014 |

* cited by examiner

SEMICONDUCTOR DEVICE AND POWER CONVERSION DEVICE

TECHNICAL FIELD

The present invention relates to a semiconductor device and a power converter.

BACKGROUND ART

As background art in the present technical field, there is a publication, Japanese Unexamined Patent Application Publication No. 2014-150279 (Patent Literature 1). In this publication, a silicon carbide semiconductor device is disclosed in which a well region having a second conductivity type, placed in an top layer portion of a region different from a cell region of a drift layer having a first conductivity type, includes an impurity region having a concentration of an impurity of the second conductivity type, ranging between $1 \times 10^{18}$ cm$^{-3}$ and $1 \times 10^{21}$ cm$^{-3}$.

CITATION LIST

Patent Literature

Patent Literature 1: Japanese Unexamined Patent Application Publication No. 2014-150279

SUMMARY OF INVENTION

Technical Problem

As a power semiconductor device for a high voltage tolerant power converter for railroad use, among others, Sic-MOSFET (Metal Oxide Semiconductor Field Effect Transistor) or SiC-IGBT (Insulated Gas Bipolar Transistor) that uses SiC (silicon carbide) for which a breakdown electric field is higher than for Si (silicon) is being developed.

Further downsizing of a power semiconductor device is under study, but, along with the downsizing, problems arise, such as a decrease in current flowing across a chip and disordered distribution of electric potentials throughout a chip.

Solution to Problem

To solve the above-noted problems, a semiconductor device according to the present invention includes a SiC substrate, an n-type epitaxial layer made of SiC and formed on a principal surface of the SiC substrate, and a plurality of p-type body regions formed to extend in a first direction within the n-type epitaxial layer and separate from each other in a second direction orthogonal to the first direction. The semiconductor device further includes a JFET region formed to extend in the first direction between p-type body regions which are adjacent to each other in the second direction, an n$^+$-type source region formed to extend in the first direction within a p-type body region, and a channel region formed to extend in the first direction and in a top layer portion of a p-type body region between an end side surface of the p-type body region and an end side surface of an n$^+$-type source region. The semiconductor device further includes a gate insulator film formed to contact the channel region, a gate electrode formed to contact the gate insulator film, an interlayer insulator film formed over the upper surface of the n-type epitaxial layer to cover the gate electrode; and a plurality of connection holes formed in the interlayer insulator film, positioned within p-type body regions to separate from each other in the first direction in a planar view. Here, the bottom surfaces of a first connection hole and a second connection hole which are adjacent to each other in the first direction are in connection with each other by an n$^+$-type source region.

Advantageous Effects of Invention

According to the present invention, it is possible to realize a large current and highly reliable power semiconductor device while shrinking a unit cell.

Problems, configurations, and advantageous effects other than described above will be apparent from the following description of embodiments.

DESCRIPTION OF EMBODIMENTS

Figure 1:
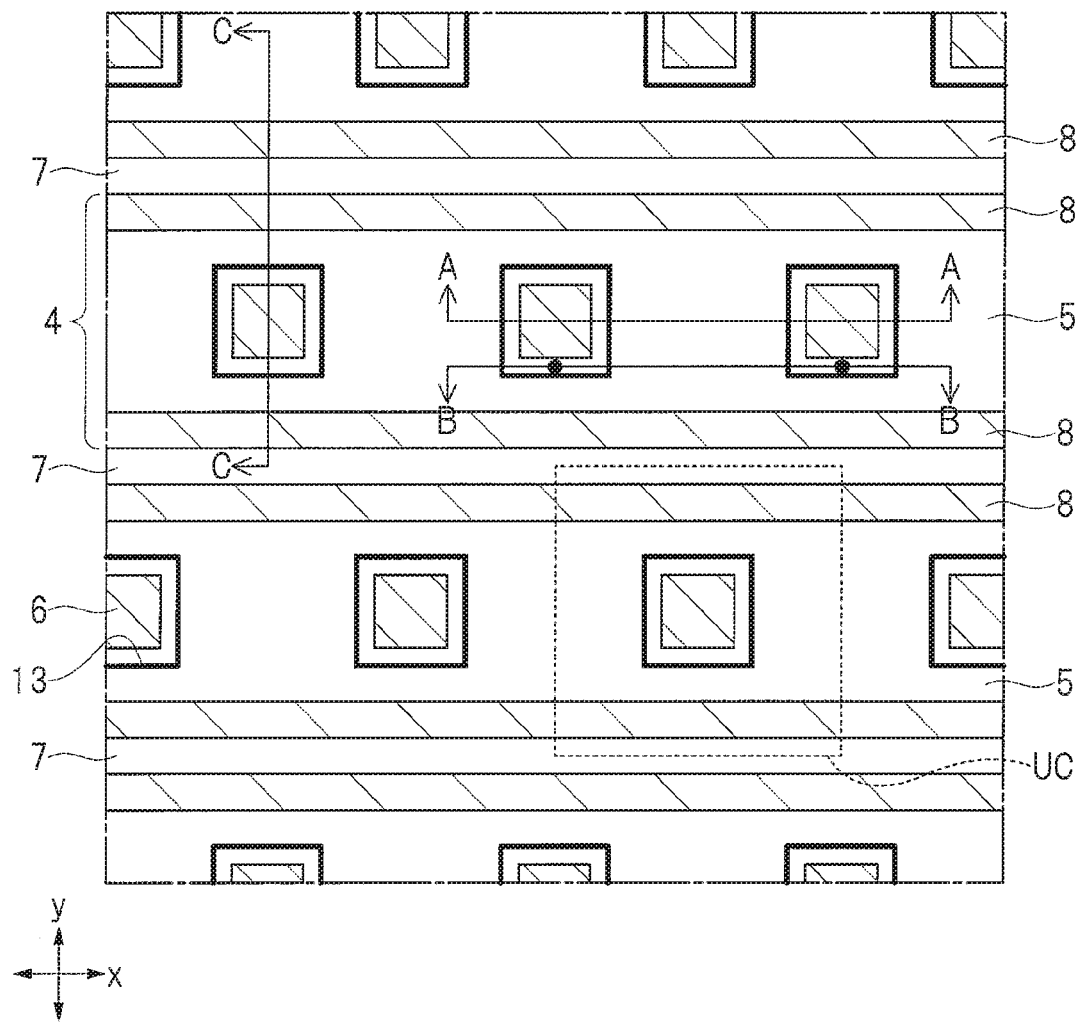
FIG. 1 is a principal part plan view depicting a portion of an element fabrication area in which a plurality of unit cells of a power semiconductor device according to a first embodiment are arrayed (a plan view of the SiC surface of a SiC-MOSFET).

In the following description of embodiments, an embodiment is divided into plural sections or embodiments, when necessary for convenience sake, and these sections or embodiments are described; unless otherwise specified, they are not independent of each other and they relate to one another such that one is an example of modification, detailed description, supplementary description, etc. of another in part or whole.

Also, in the following description of embodiments, where the number of elements or the like (including the number of pieces, a numeric value, quantity, range, etc.) is mentioned, that number should not be limited to a particular number mentioned and may be more or less than the particular number, unless otherwise specified and unless that number is, in principle, obviously limited to the particular number.

Further, for an embodiment which will be described hereinafter, needless to say, its components (including constituent steps or the like) are not always necessary, unless otherwise specified and unless such components are, in principle, considered to be obviously necessary.

Further, when such wording appears that a subject "comprises elements A", "is comprised of elements A" "has elements A", and "includes elements A", needless to say, it does not mean exclusion of elements other than those elements, unless it is specifically noted, inter alia, that it comprises only those elements. Likewise, in an embodiment which will be described hereinafter, when the shape of a component or the like, a positional relation between components, etc. are described, such description should be construed to include those that are substantially similar or analogous to the shape or the like, unless otherwise specified and unless such description is, in principle, considered to be obviously exclusive. This is also true for numeric values and ranges mentioned above.

Further, a drawing, even a plan view which is used to explain an embodiment hereinafter, may partially be hatched to make the drawing easily viewable. In all diagrams for explaining an embodiment hereinafter, those having the same function are assigned the same reference numeral and duplicated description thereof is dispensed with. In the following, embodiments will be described in detail, based on the drawings.

First, descriptions are provided about a power semiconductor device examined by the present inventors prior to the present invention. The following description concerns a SiC-MOSFET to which the invention made by the present inventors is primarily applied among several types of power semiconductor devices.

Figure 26:
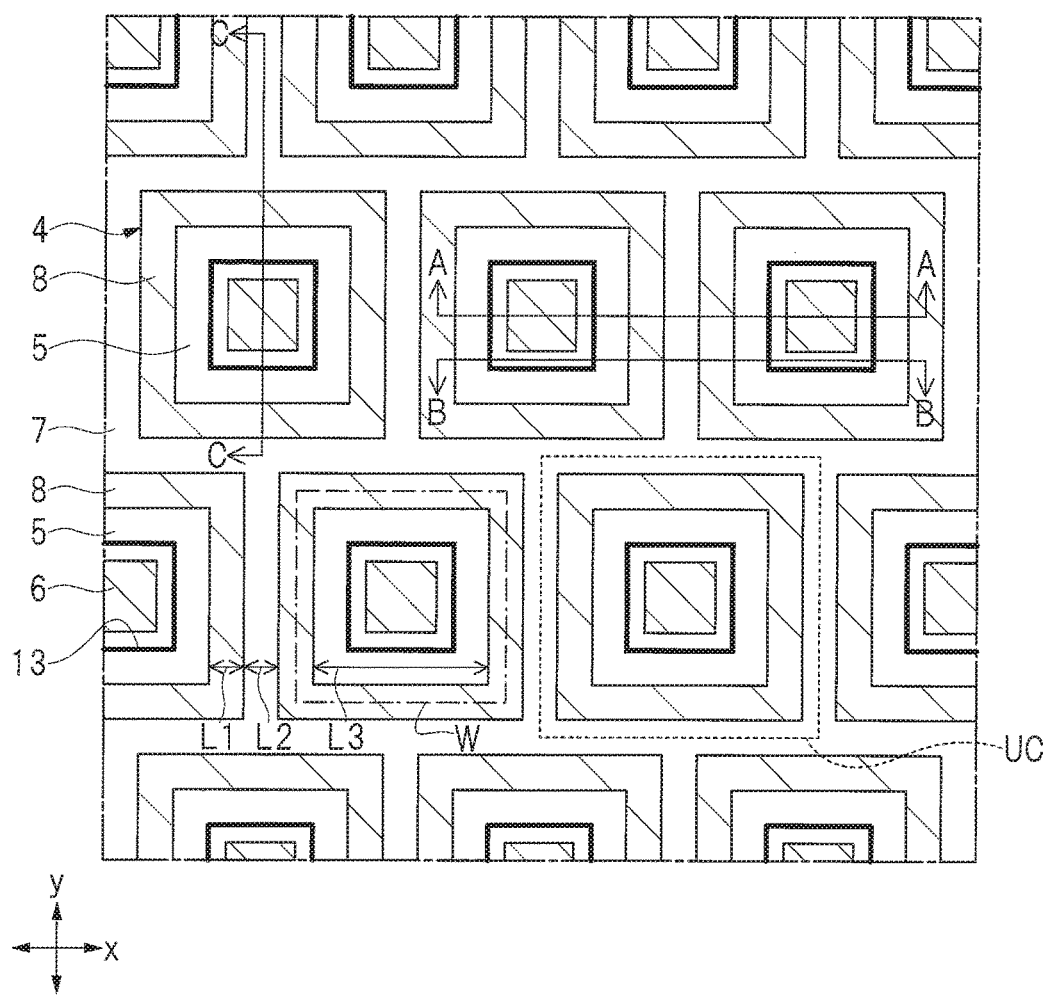
FIG. 26 is a principal part plan view depicting a portion of an element fabrication area in which a plurality of unit cells of a power semiconductor device examined by the present inventors are arrayed (a plan view of the SiC surface of a SiC-MOSFET).
Figure 27:
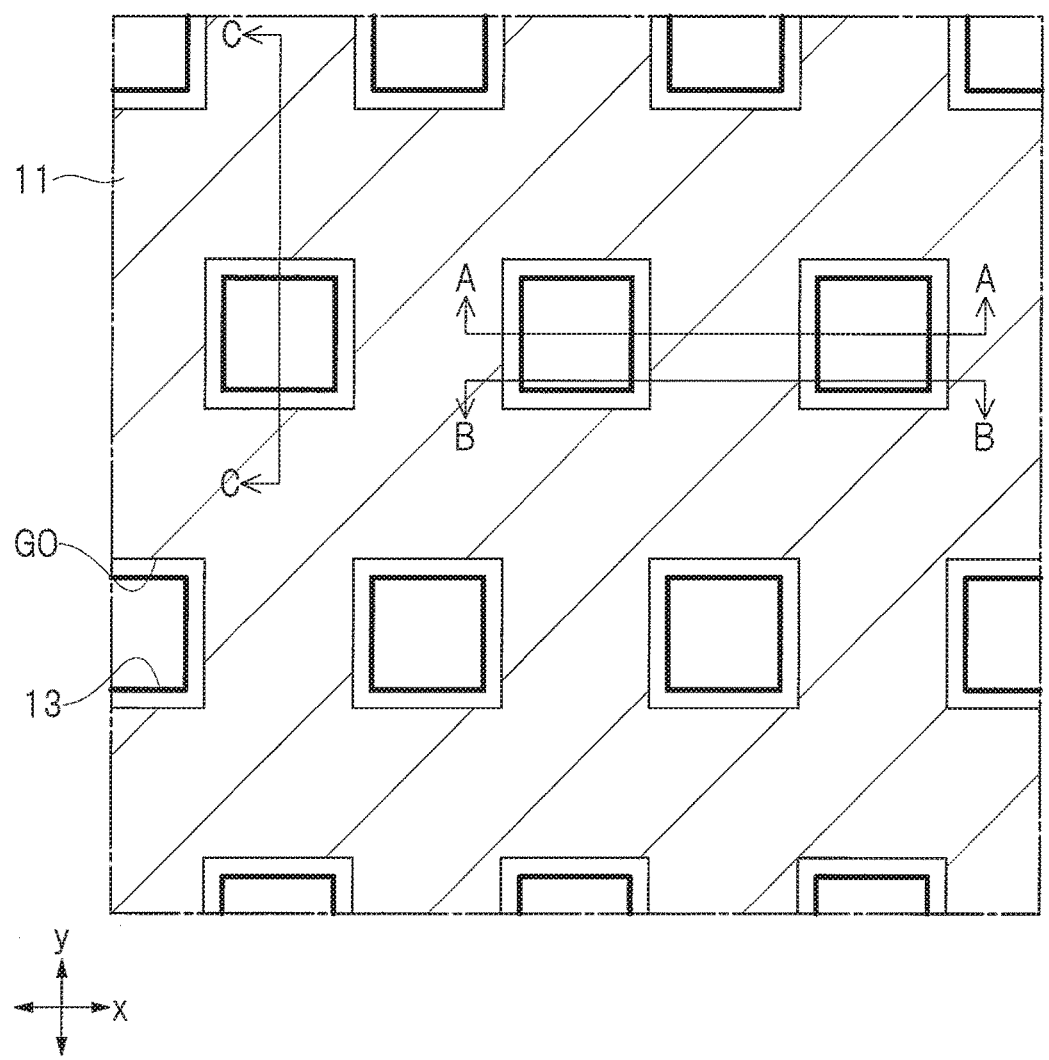
FIG. 27 is a principal part plan view depicting a portion of an element fabrication area in which a plurality of unit cells of the power semiconductor device examined by the present inventors are arrayed (a plan view depicting a gate electrode and connection holes in the SiC-MOSFET).
Figure 28:
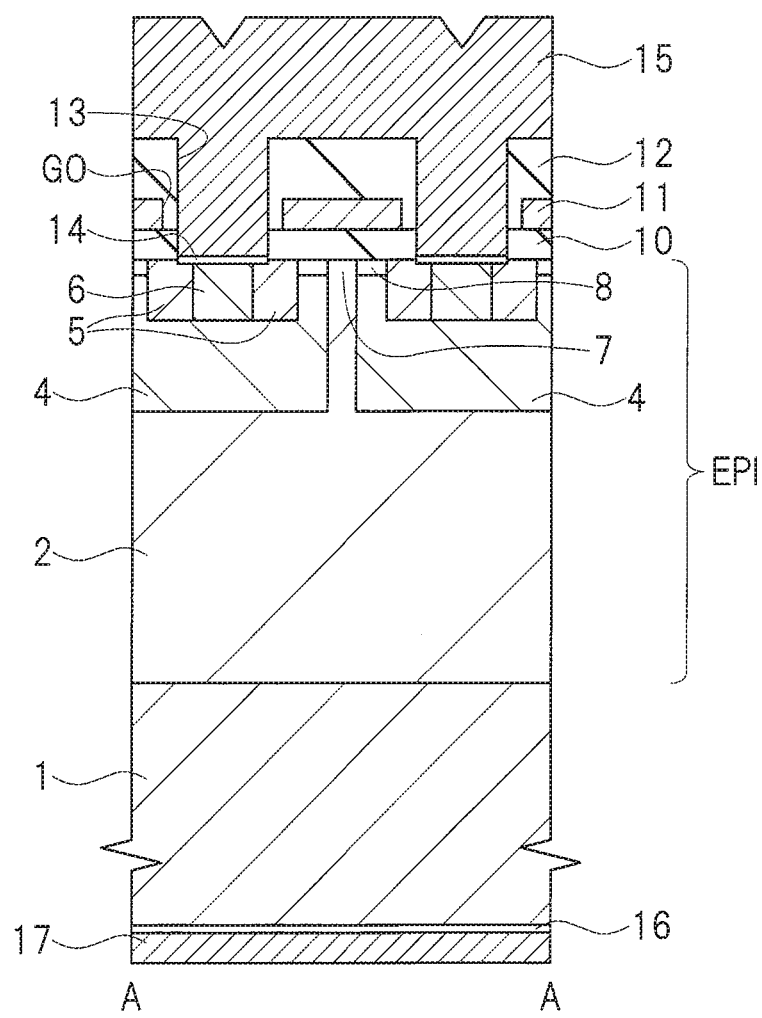
FIG. 28 is a cross-sectional view along line A-A on FIGS. 26 and 27.
Figure 29:
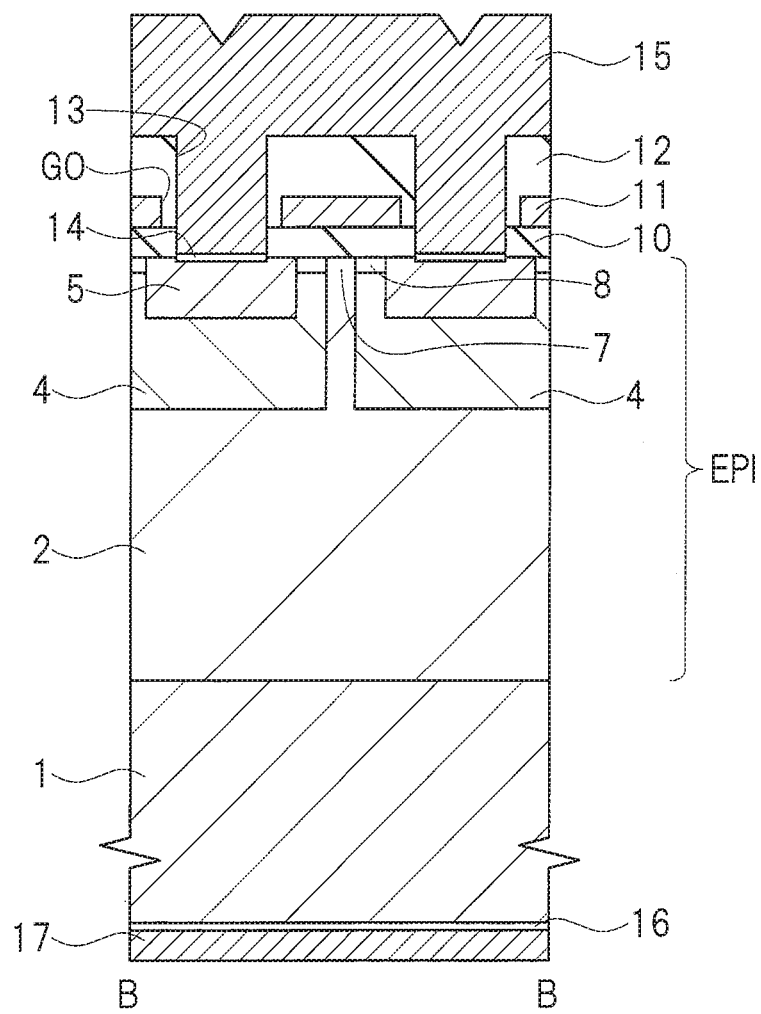
FIG. 29 is a cross-sectional view along line B-B on FIGS. 26 and 27.
Figure 30:
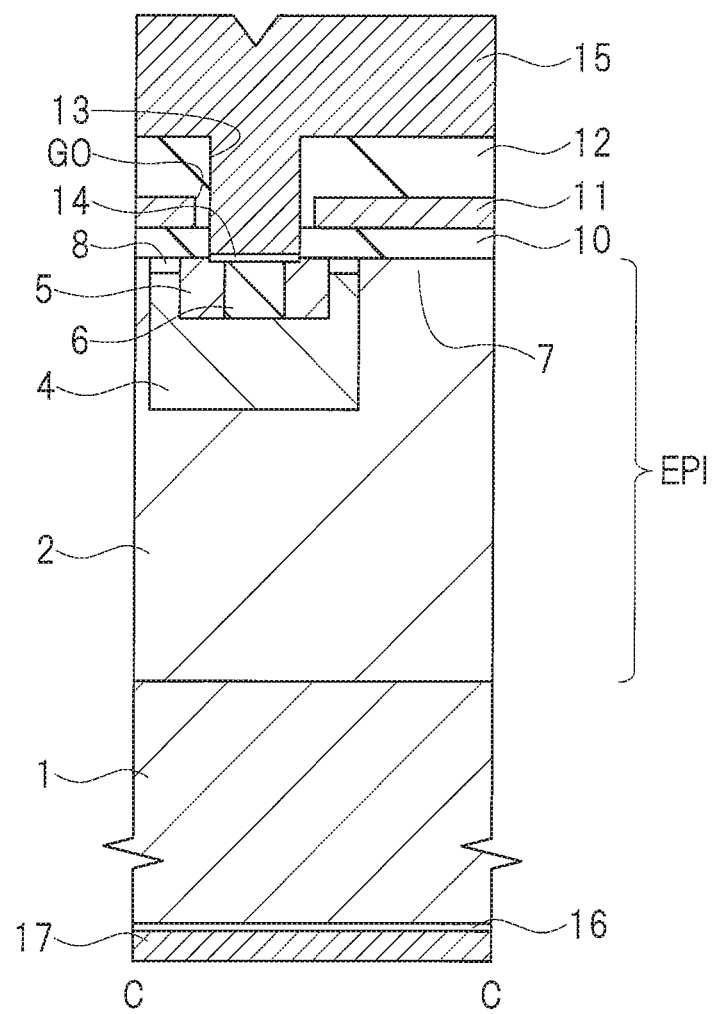
FIG. 30 is a cross-sectional view along line C-C on FIGS. 26 and 27.

One example of a SiC MOSFET examined by the present inventors is depicted in FIGS. 26 to 30. FIGS. 26 and 27 are principal part plan views depicting a portion of an element fabrication area in which a plurality of unit cells of the SiC-MOSFET are arrayed. FIG. 26 is a plan view of the SiC surface of the SiC-MOSFET and FIG. 27 is a plan view depicting a gate electrode and connection holes. FIGS. 28 to 30 are principal part cross-sectional views of the SiC-MOSFET. FIG. 28 is a cross-sectional view along a line marked A-A on FIGS. 26 and 27, FIG. 29 is a cross-sectional view along a line marked B-B on FIGS. 26 and 27, and FIG. 30 is a cross-sectional view along a line marked C-C FIGS. 26 and 27.

On the surface (first principal surface) of an $n^+$-type SiC substrate 1, an n-type drift layer 2 formed of an n-type epitaxial layer EPI is formed. Further, a plurality of p-type body regions 4 are formed in an upper portion of the n-type drift layer 2 and an $n^+$-type source region 5 and a $p^+$-type potential clamping region 6 are formed in an upper portion of the p-type body regions 4. Also, a drain wiring electrode 17 is formed on the rear surface (second principal surface) of the $n^+$-type SiC substrate 1.

A portion of an n-type drift layer 2 which is sandwiched between two p-type body regions 4 and exposed on the upper surface of the n-type epitaxial layer EPI is a JFET (Junction Field Effect Transistor) region 7. A portion of a p-type body region which is sandwiched between a JFET region 7 and an n-type source region 5 and exposed on the upper surface of the n-type epitaxial layer EPI is a channel region 8. Here, the length (denoted as L1 in FIG. 26) of a channel region 8 from the JFET region 7 to the n-type source region 5 is called a channel length and its width (making W in FIG. 26) in a direction orthogonal to the channel length is called a channel width.

As depicted in FIGS. 26 and 27, in a planar view, a JFET region 7 is shaped like a mesh, a channel region 8 is shaped like a box, an n$^+$-type source region 5 is shaped like a box, and a gate electrode 11 is shaped like a mesh. A region including one channel region 8 shaped like a box is referred to as a unit cell UC herein.

It is desired to enable a larger amount of current to flow across one SiC-MOSFET. This is because, if a larger amount of current is allowed to flow across one SiC-MOSFET, the number of chips required to be present in a power converter can be reduced and it is possible to downsize the power converter by reducing bonding regions.

To enable a larger amount of current to flow across one SiC-MOSFET (one chip), it is effective to increase an aggregated channel width in one SiC-MOSFET. An increase in an aggregated channel width can be made by reducing the size of a unit cell UC and increasing the number of unit cells per SiC-MOSFET (chip). From a perspective of maintaining voltage resistivity, it is difficult to extremely shorten the JFET length (denoted as L2 in FIG. 26) of a JFET region 7 or the channel length L1 of a channel region 8. However, it is possible to reduce the size of a unit cell UC by reducing the size (denoted as L3 in FIG. 26) of a connection hole 13 or an n$^+$-type source region 5 owing to improved accuracy of fabrication.

However, the examination made by the present inventors has revealed that, when the size L3 of an n$^+$-type source region 5 becomes smaller than the sum of the JFET length L2 of a JFET region 7 and the double of the channel length L1 of a channel region, an effect of increasing the channel width W by shrinking the n-type source region 5 is lost.

Consequently, there is a need for a cell structure that allows a larger current to flow across one SiC-MOSFET, while the size of a unit cell UC is reduced, in order to realize downsizing of a power converter.

Further, because the breakdown electric field for SiC is about ten times or more as high as that for Si, the JFET length L2 required for a SiC transistor to maintain voltage resistivity is narrower than the JFET length for a Si transistor. For example, the JFET length for SiC-IGBT is on the order of several tens of micrometers (μm) and the JFET length for SiC-MOSFET is on the order of several micrometers (μm). A shorter JFET length L2 is good from a perspective of gaining current by increasing the number of unit cells UCs per SiC-MOSFET. However, this makes the width of a gate electrode 11 narrower, which, in turn, produces a resistance component in a horizontal direction of a gate electrode 11. Variance occurs in the potentials of gate electrodes 11 throughout the chip and this is liable to result in an increase in loss during power conversion or local heat generation. Local heat generation should be suppressed, because it results in a decrease in breakdown resistance capacity of a SiC-MOSFET. Further, if local heat generation can be prevented, making a power converter smaller and lighter can be realized by simplifying a cooling mechanism.

Hence, to prevent the characteristics of a power converter from deteriorating and make it smaller and lighter, it is needed to reduce the resistance component in a horizontal direction of a gate electrode 11 in a SiC-MOSFET and suppress potential variance throughout the chip.

First Embodiment

<<Structure of SiC-MOSFET>>

Figure 2:
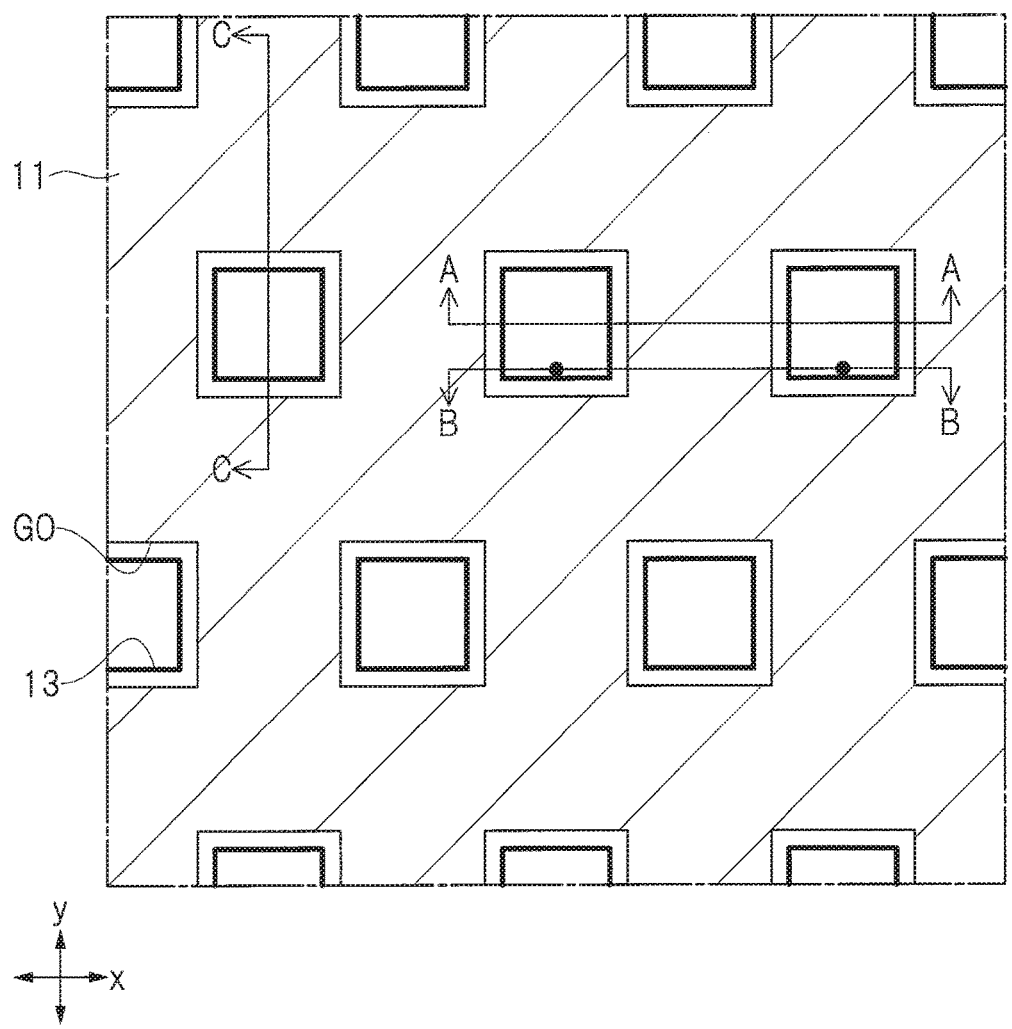
FIG. 2 is a principal part plan view depicting a portion of an element fabrication area in which a plurality of unit cells of the power semiconductor device according to the first embodiment are arrayed (a plan view depicting a gate electrode and connection holes in the SiC-MOSFET).
Figure 3:
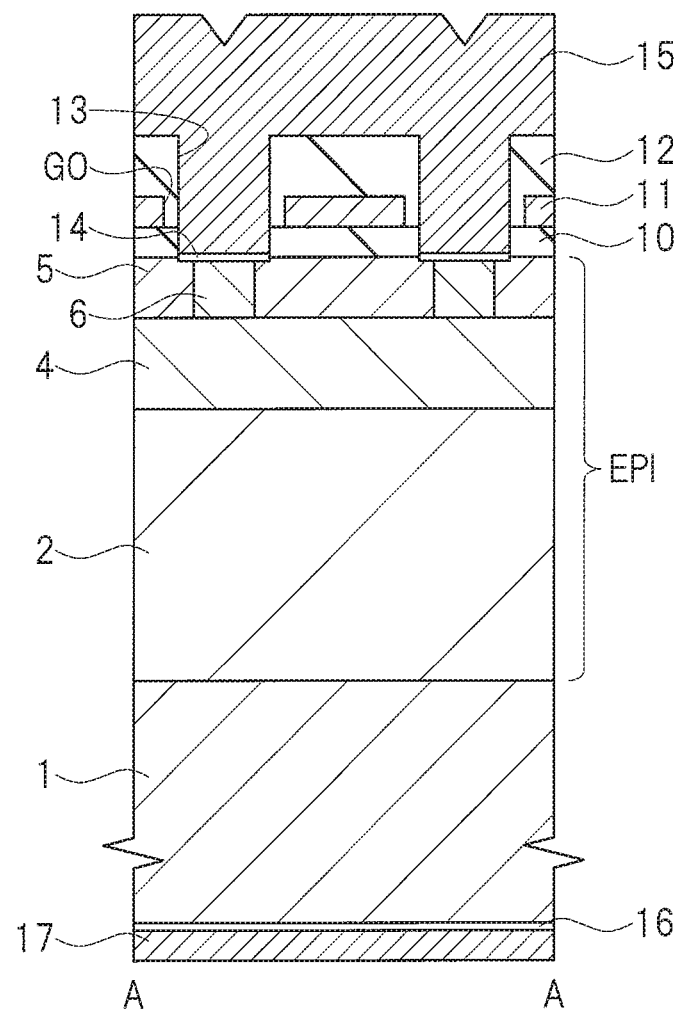
FIG. 3 is a cross-sectional view along line A-A on FIGS. 1 and 2.
Figure 4:
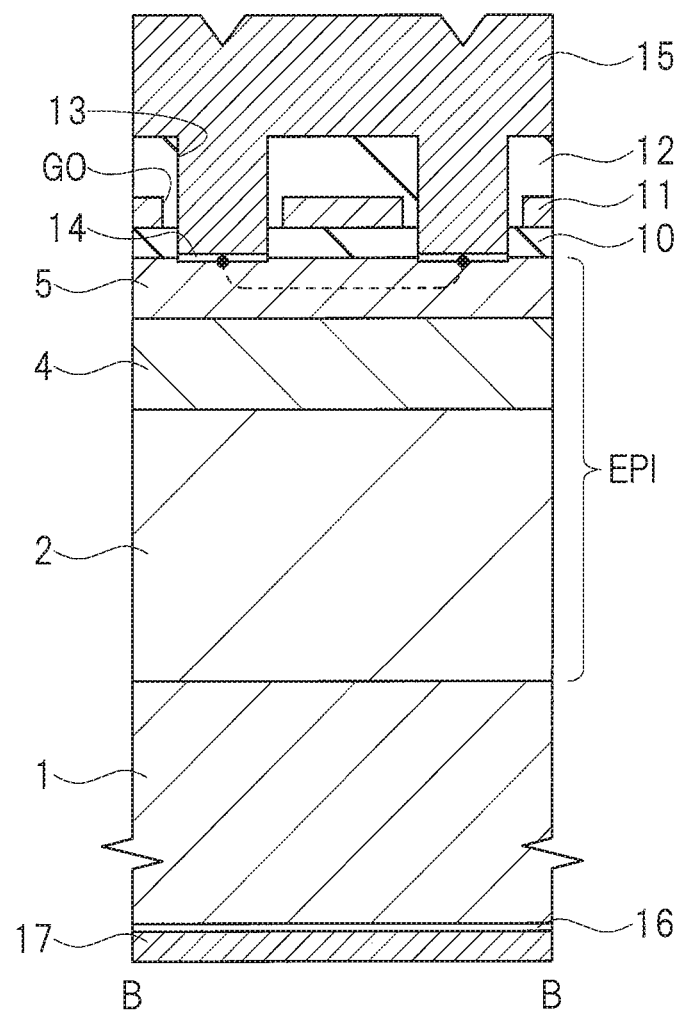
FIG. 4 is a cross-sectional view along line B-B on FIGS. 1 and 2.
Figure 5:
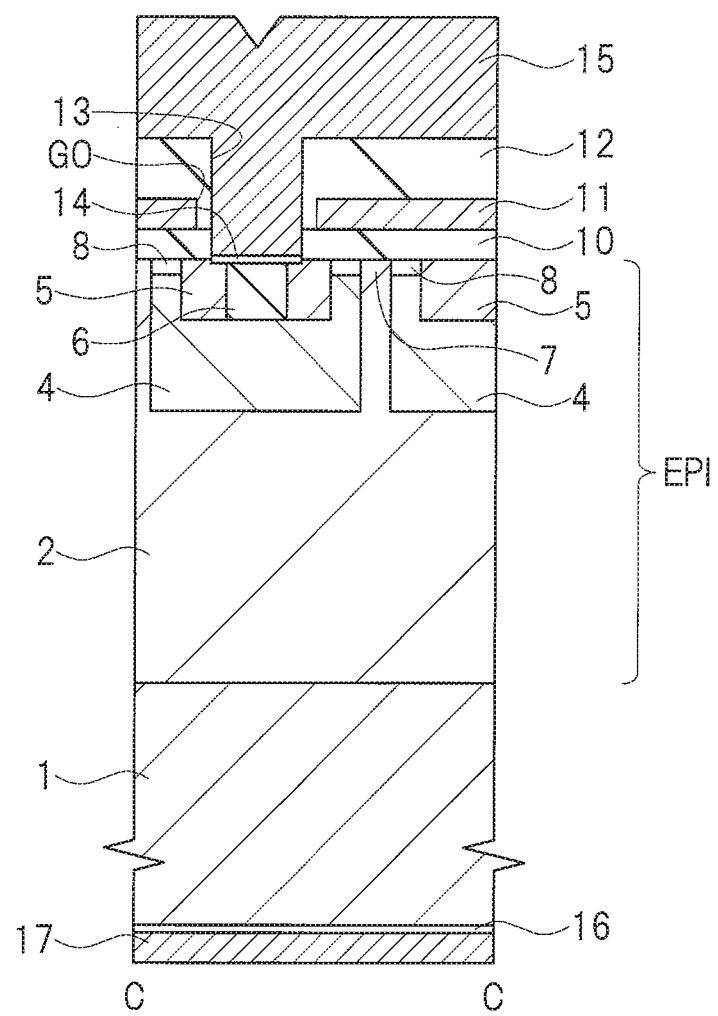
FIG. 5 is a cross-sectional view along line C-C on FIGS. 1 and 2.

A structure of a SiC-MOSFET according to a first embodiment is described with FIGS. 1 to 5. FIGS. 1 and 2 are principal part plan views depicting a portion of an element fabrication area in which a plurality of unit cells of the SiC-MOSFET according to the first embodiment are arrayed. FIG. 1 is a plan view of the SiC surface of the SiC-MOSFET and FIG. 2 is a plan view depicting a gate electrode and connection holes. FIG. 3 is a principal part cross-sectional view (a cross-sectional view along line A-A on FIGS. 1 and 2) of the SiC-MOSFET according to the first embodiment. FIG. 4 is a principal part cross-sectional view (a cross-sectional view along line B-B on FIGS. 1 and 2) of the SiC-MOSFET according to the first embodiment. FIG. 5 is a principal part cross-sectional view (a cross-sectional view along line C-C on FIGS. 1 and 2) of the SiC-MOSFET according to the first embodiment. The SiC-MOSFET is a MOSFET having a planar DMOS (Double diffused Metal Oxide Semiconductor) structure and a region marked UC in FIG. 1 is a unit cell.

On the surface of (first principal surface) of an n$^+$-type SiC substrate 1 made of SiC, an n-type epitaxial layer EPI with a lower impurity concentration than the n$^+$-type SiC substrate 1 is formed. A SiC epitaxial substrate is comprised of the n$^+$-type SiC substrate 1 and the n-type epitaxial layer EPI. The thickness of the n-type epitaxial layer EPI is on the order of 5.0 to 100.0 μm.

Within the n-type epitaxial layer EPI, a plurality of p-type body regions (well regions) 4 are formed, separating from each other and having a first depth from the upper surface of the n-type epitaxial layer EPI. The plurality of p-type body regions 4 are formed to elongate linearly, extending in an x direction (first direction) and having a first width in a y direction (second direction) orthogonal to the x direction on the upper surface of the n-type epitaxial layer EPI. And, the plurality of p-type body regions 4 are formed, separating from each other in the y direction. The first depth of the p-type body regions 4 from the upper surface of the n-type epitaxial layer EPI is, e.g., on the order of 0.5 to 2.0 μm.

Within each p-type body region 4, an n$^+$-type source region 5 is formed, having a second depth shallower than the first depth from the upper surface of the n-type epitaxial layer EPI. The n$^+$-type source region 5 is formed within a p-type body region 4, separating from an end side surface of the p-type body region 4 in the y direction, and formed to elongate linearly, extending in the x direction and having a second width narrower than the first width in the y direction. The second depth of the n$^+$-type source region 5 from the upper surface of the n-type epitaxial layer EPI is, e.g., on the order of 0.1 to 0.5 μm.

Also, within each p-type body region 4, a plurality of p$^+$-type potential clamping regions 6 which clamp the potential of the p-type body region 4 are formed, separating from each other in the x direction. The p$^+$-type potential clamping regions are formed, extending from the upper surface of the n-type epitaxial layer EPI up to the p-type body region 4 in a depth direction of the n-type epitaxial layer EPI.

Further, a region sandwiched between p-type body regions 4 adjacent to each other in the y direction is a portion that functions as a JFTE region (doping region) 7. The JFET region 7 is formed to elongate linearly, extending in the x direction.

A portion of a p-type body region 4 positioned between an end side surface of the p-type body region 4 in the y direction (the interface between the JFET region 7 and the p-type body region 4) and an end side surface of an n⁺-type source region 5 in the y direction (the interface between the p-type body region 4 and n⁺-type source region 5) is a portion that functions as a channel region 8. Therefore, the channel region 8 is formed to elongate linearly, extending in the x direction.

Within an n-type epitaxial layer EPI, a region where a p-type body region 4 is not formed is a region that functions as an n-type drift layer 2 which takes a role for ensuring voltage resistivity. Further, the n⁺-type SiC substrate 1 is a region that functions as a drain layer.

And now, "−" and "+" are signs denoting a relative impurity concentration of an impurity whose conductivity type is n-type or p-type. For example, impurity concentration of an n-type impurity becomes higher in order of "n⁻", "n" and "n⁺" and impurity concentration of a p-type impurity becomes higher in order of "p⁻", "p" and "p⁺".

A preferable range of specific resistance of an n⁺-type SiC substrate 1 is, e.g., on the order of 0.01 to 0.1 Ωcm. A preferable range of impurity concentration of an n-type drift layer 2 is, e.g., on the order of $1 \times 10^{15}$ to $1 \times 10^{16}$ cm⁻³. A preferable range of impurity concentration of a p-type body region 4 is, e.g., on the order of $2 \times 10^{16}$ to $5 \times 10^{17}$ cm⁻³. A preferable range of impurity concentration of an n⁺-type source region 5 is, e.g., on the order of $5 \times 10^{19}$ to $2 \times 10^{20}$ cm³. A preferable range of impurity concentration of a p⁺-type potential clamping region 6 is, e.g., on the order of $1 \times 10^{19}$ to $1.5 \times 10^{20}$ cm⁻³.

A gate insulator film 10 is formed over a JFET region 7 and a channel region 8 and a gate electrode 11 is formed over the gate insulator film 10. Further, an opening GO is formed in a gate electrode 11 so that a gate electrode 11 and a p⁺-type potential clamping region 6 do not overlap in a planar view. This opening GO is formed to be larger than a connection hole 13.

A gate insulator film 10 and a gate electrode 11 are covered by an interlayer insulator film 12. A plurality of connection holes 13 are formed in the interlayer insulator film 12. On the bottom surface of a connection hole 13, a part of an n⁺-type source region 5 and a p⁺-type potential clamping region 6 are exposed and a metallic silicide layer 14 is formed over the upper surfaces of these regions. A p⁺-type potential clamping region 6 is placed inside a connection hole 13 in a planar view. Now, as described previously, an n⁺-type source region 5 is formed to elongate linearly, extending in the x direction and having the second width. Therefore, two connection holes 13 which are adjacent in the x direction are in connection with each other via an n⁺-type source region 5, as indicated by black circles and a dotted line in FIG. 4.

Moreover, a part of an n⁺-type source region 5 and a p⁺-type potential clamping region 6 are electrically connected with a source wiring electrode 15 via a metallic silicide layer 14. Further, the rear surface (second principal surface) of the n⁺-type SiC substrate 1 is electrically connected with a drain wiring electrode 17 via a metallic silicide layer 16. Likewise, a gate electrode 11 is electrically connected with a gate wiring electrode which is omitted from depiction. A source potential is externally applied to the source wiring electrode 15, a drain potential is externally applied to the drain wiring electrode 17, and a gate potential is externally applied to the gate wiring electrode.

Then, descriptions are provided about features and advantageous effects of the structure of the SiC-MOSFET according to the first embodiment.

For example, as described with FIGS. 26 to 30 mentioned previously, in the case of a SiC-MOSFET in which a channel region 8 is shaped like a box, with shrinkage of a unit cell UC, when the size L3 of an n⁺-type source region 5 becomes smaller than the sum of the JFET length L2 of a JFET region 7 and the double of the channel length L1 of a channel region, an advantageous effect in which the channel width W increased with shrinkage of the n⁺-type source region 5 is lost or reduced. However, since a channel region 8 is shaped to elongate linearly in the SiC-MOSFET according to the first embodiment, even with the shrinkage of a unit cell UC, an aggregated channel width of channel regions 8 can be made longer than in the case of box-shaped channel regions 8. Thereby, it is possible to allow a larger current to flow across one SiC-MOSFET, while reducing the size of a unit cell UC in the SiC-MOSFET. As a result, it is possible to realize downsizing of a power converter using SiC-MOSFETs as switching elements.

Further, a gate electrode 11 is formed in a position in which it does not overlap with a p⁺-type potential clamping region 6 in a planar view. That is, a gate electrode is formed between connection holes 13 which are adjacent in the x direction in addition to being formed over a JFET region 7 and a channel region 8. Thereby, it is possible to suppress the occurrence of a resistance component in a horizontal direction of a gate electrode 11, while reducing the size of a unit cell UC in the SiC-MOSFET. This impedes variance from occurring in the potentials of gate electrodes 11 throughout the chip and it is therefore possible to suppress a decrease in the breakdown resistance capacity of a SiC-MOSFET because of local heat generation or the like. Consequently, a cooling mechanism can be simplified and making a power converter smaller and lighter can be realized.

Additionally, a p⁺-type potential clamping region 6 is placed inside a connection hole 13 in a planar view and a gate electrode 11 is formed in a position in which it does not overlap with a p⁺-type potential clamping region 6. Therefore, even though the upper surface of an n-type epitaxial layer EPI gets rough, when a p⁺-type potential clamping region 6 is formed, it is possible to prevent a leakage current and temporal insulation breakdown of a gate insulator film 10.

As noted in the foregoing, according to the first embodiment, it is possible to realize a large current and highly reliable SiC-MOSFET while shrinking a unit cell UC.

Figure 6:
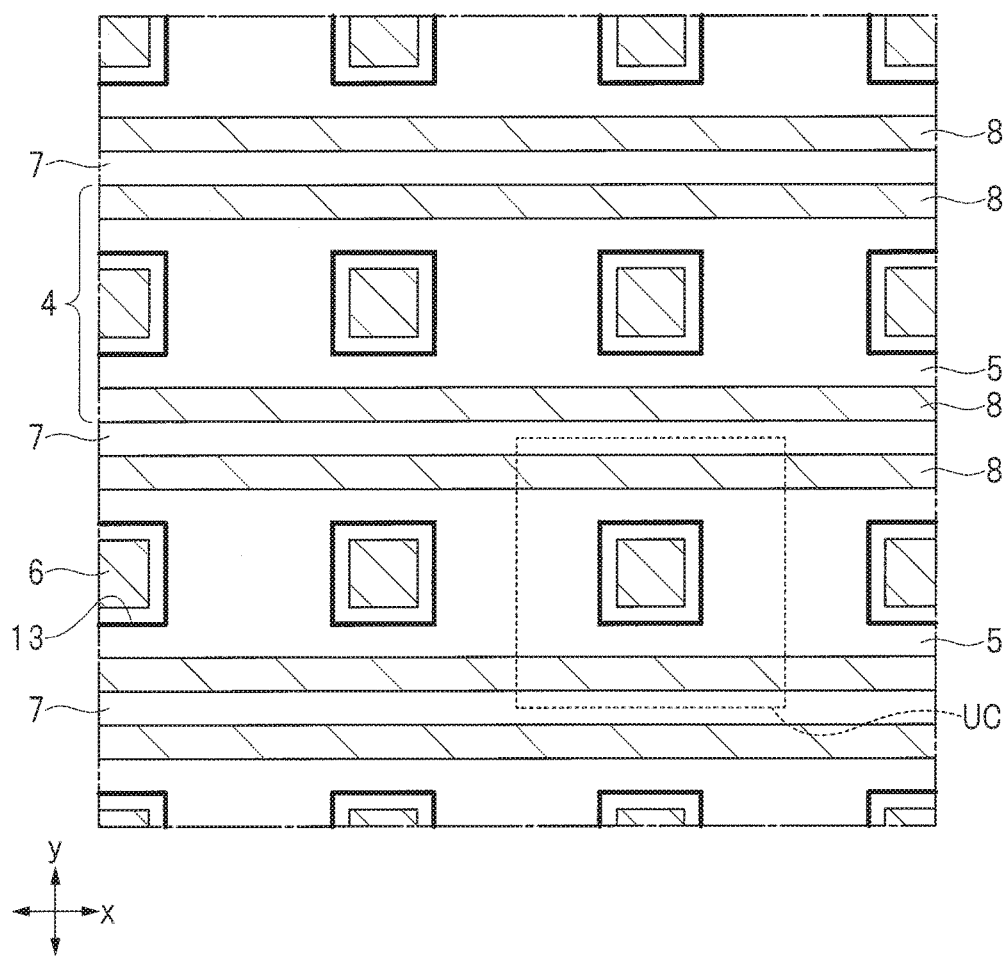
FIG. 6 is a principal part plan view depicting an example of modification to a portion of an element fabrication area in which a plurality of unit cells of the power semiconductor device according to the first embodiment are arrayed (a plan view of the SiC surface of the SiC-MOSFET).
Figure 7:
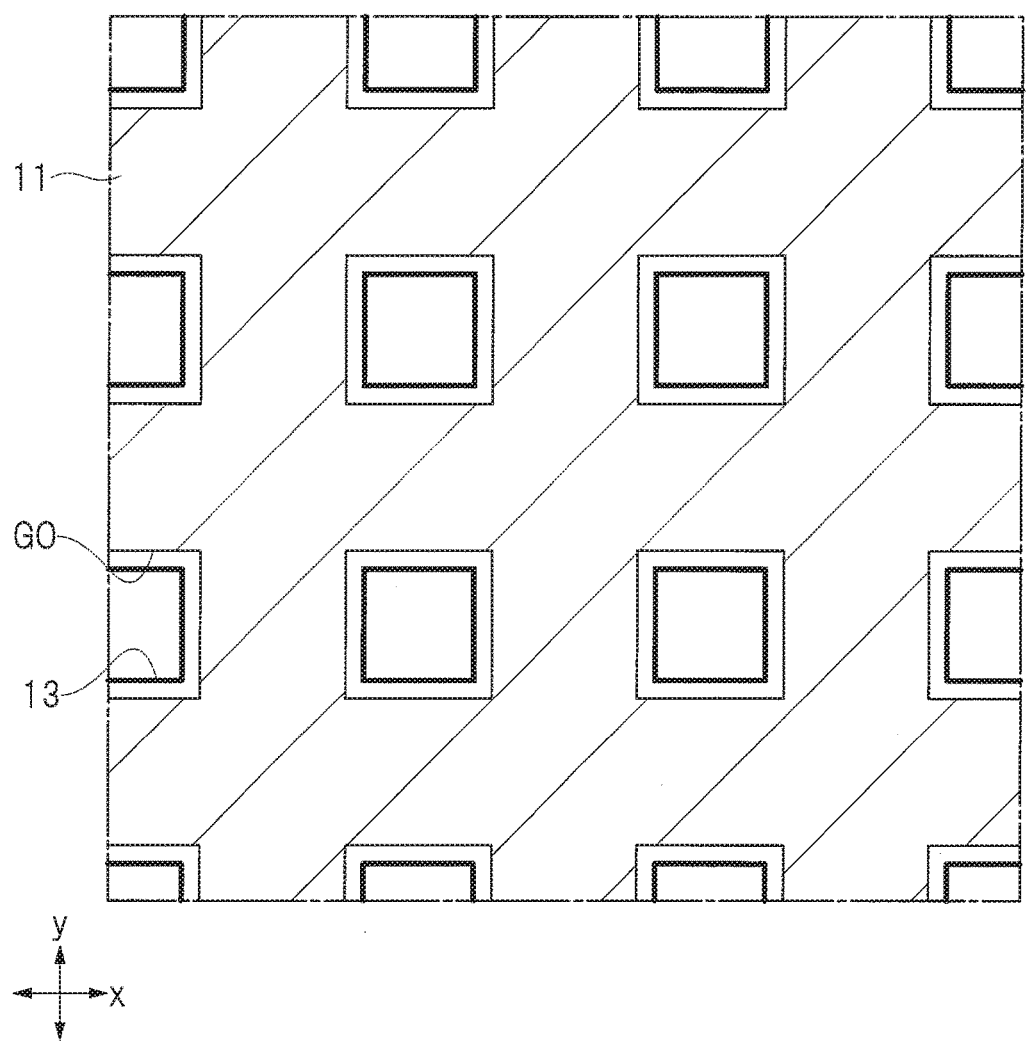
FIG. 7 is a principal part plan view depicting the example of modification to a portion of an element fabrication area in which a plurality of unit cells of the power semiconductor device according to the first embodiment are arrayed (a plan view depicting a gate electrode and connection holes in the SiC-MOSFET).

An example of modification to a portion of an element fabrication area in which a plurality of unit cells of the SiC-MOSFET according to the first embodiment are arrayed is depicted in FIGS. 6 and 7. FIG. 6 is a principal part plan view depicting an example of modification to a portion of an element fabrication area in which a plurality of unit cells of the SiC-MOSFET according to the first embodiment are arrayed (a plan view of the SiC surface of the SiC MOSFET). FIG. 7 is a principal part plan view depicting the example of modification to a portion of an element fabrication area in which a plurality of unit cells of the SiC-MOSFET according to the first embodiment are arrayed (a plan view depicting a gate electrode and connection holes).

In FIGS. 1 and 2 mentioned previously, a plurality of p⁺-type potential clamping region 6, i.e., connection holes 13 are placed in a staggered arrangement; however, no limitation to this is not intended. For example, as depicted in FIGS. 6 and 7, they may be placed at intersections between a plurality of parallel lines extending in the x direction and a plurality of parallel lines extending in the y direction in a group of parallel lines.

<<Power Converter (Inverter)>>

Figure 8:
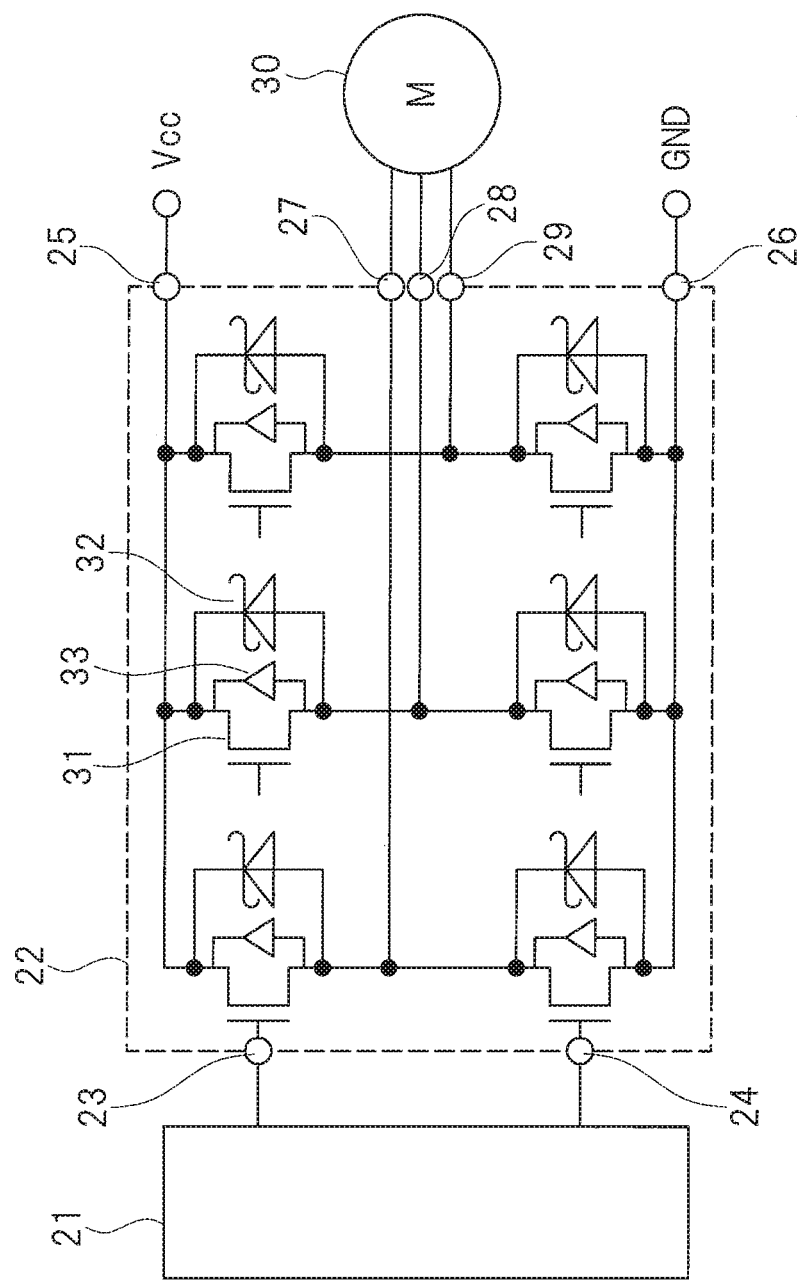
FIG. 8 is a circuit diagram depicting one example of a power converter (inverter) using SiC-MOSFETS according to the first embodiment as switching elements.

With FIG. 8, descriptions are provided about a power converter (inverter) using SiC-MOSFETS according to the first embodiment as switching elements. FIG. 8 is a circuit diagram depicting one example of a power converter (inverter) using SiC-MOSFETS according to the first embodiment as switching elements.

As depicted in FIG. 8, an inverter according to the present embodiment includes a control circuit 21 and a power module 22. The control circuit 21 and power module 22 are connected by terminals 23 and 24. The power module 22 is connected to a power supply potential (Vcc) via a terminal 25 and to a ground potential (GND) via a terminal 26. Output of the power module 22 is connected to a three-phase motor 30 via terminals 27, 28, and 29.

The power modules 22 is equipped with SiC-MOSFETs 31 according to the first embodiment as switching elements. Also, an external backflow diode 32 is connected to each SiC-MOSFET 31. The backflow diode 32 is provided to relieve an electric field that is applied to the interface (Schottky interface) between a metal and a semiconductor when a voltage is applied in a reverse direction and suppress a leakage current during operation in a reverse direction. In FIG. 8, a diode denoted by reference numeral 33 is a body diode comprised of a $p^+$-type potential clamping region 6 and an $n^+$-type SiC substrate 1 formed in a SiC-MOSFET 31 (see FIG. 3).

For each single phase, a SiC-MOSFET 31 and a backflow diode 32 are connected antiparallely between the power supply potential (Vcc) and the input potential of the three-phase motor 30. A SiC-MOSFET 31 and a backflow diode 32 are connected antiparallely also between the input potential of the three-phase motor 30 and the ground potential (GND). That is, two SiC-MOSFETs 31 and two backflow diodes 32 are provided for each single phase of the three-phase motor 30 and six SiC-MOSFETs 31 and six backflow diodes 32 are provided for three phases. And, the control circuit 21 is connected to the gate electrodes of individual SiC MOSFETs 31 and the SiC-MOSFETs 31 are controlled by this control circuit 21. Therefore, the control circuit 21 controls a current to flow through the SiC-MOSFETs 31 in the power module 22 and the three-phase motor 30 can thus be driven.

The SiC-MOSFETs 31 according to the first embodiment can provide a larger current flow and high reliability while reducing the size of a unit cell UC and, therefore, it is possible to realize downsizing of the power module 22 using the SiC-MOSFETs 31 as switching elements.

Second Embodiment

Figure 9:
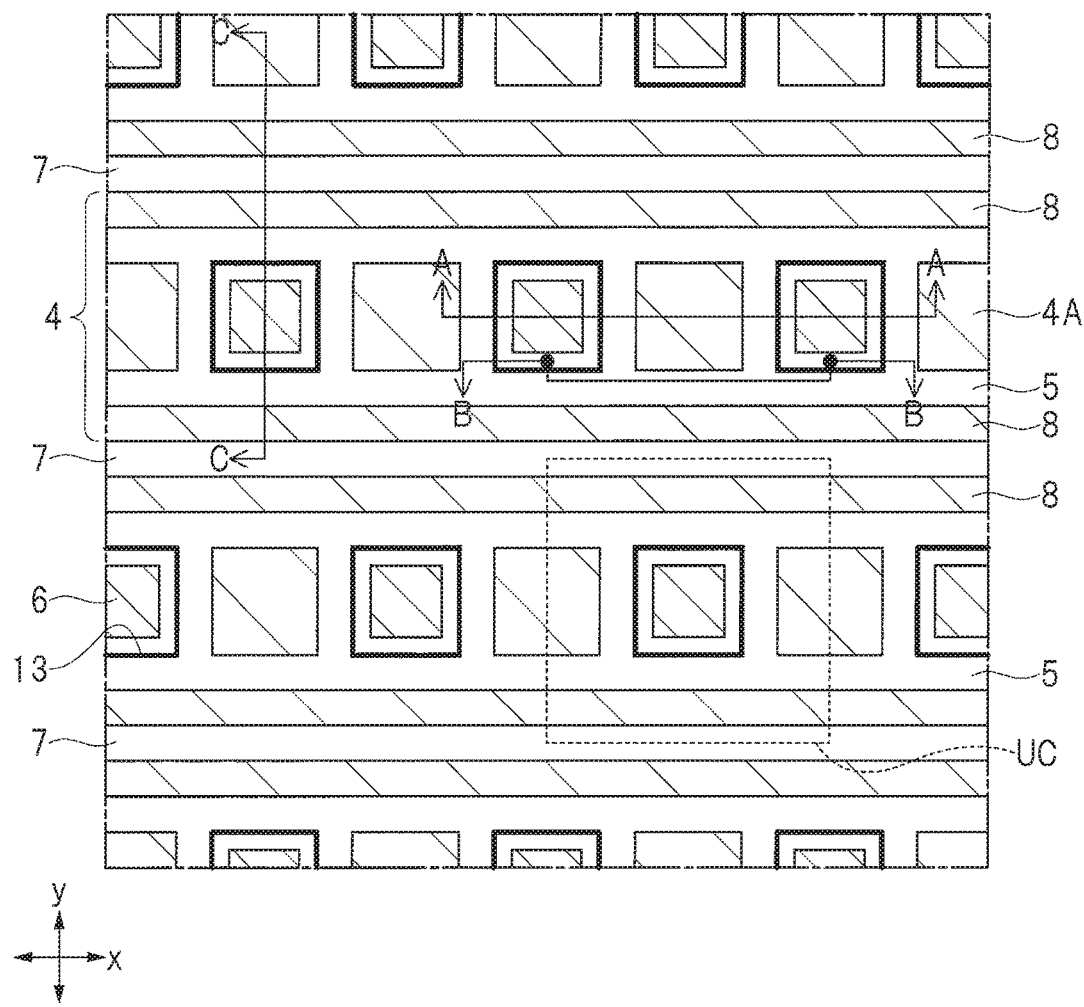
FIG. 9 is a principal part plan view depicting a portion of an element fabrication area in which a plurality of unit cells of a power semiconductor device according to a second embodiment are arrayed (a plan view of the SiC surface of a SiC-MOSFET).
Figure 10:
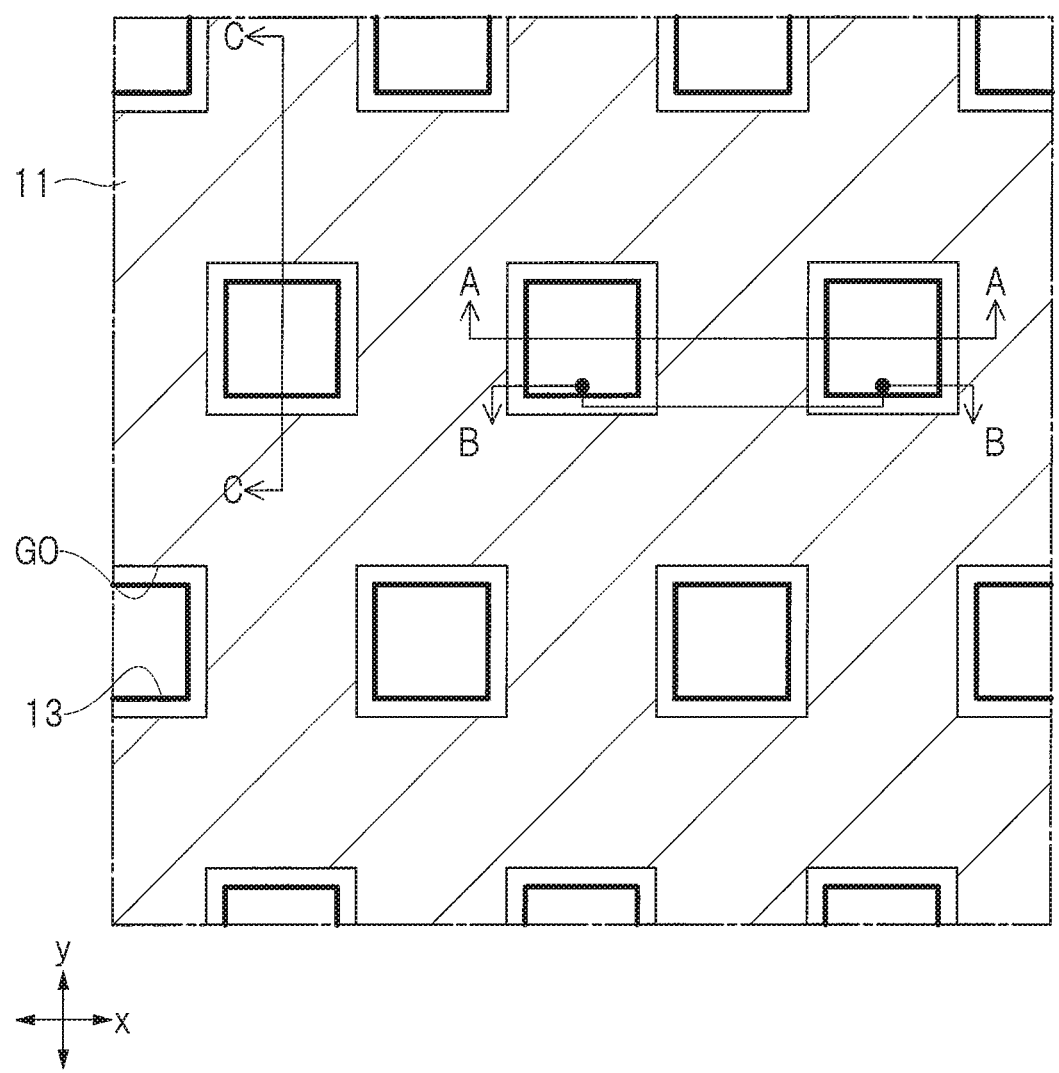
FIG. 10 is a principal part plan view depicting a portion of an element fabrication area in which a plurality of unit cells of the power semiconductor device according to the second embodiment are arrayed (a plan view depicting a gate electrode and connection holes in the SiC-MOSFET).
Figure 11:
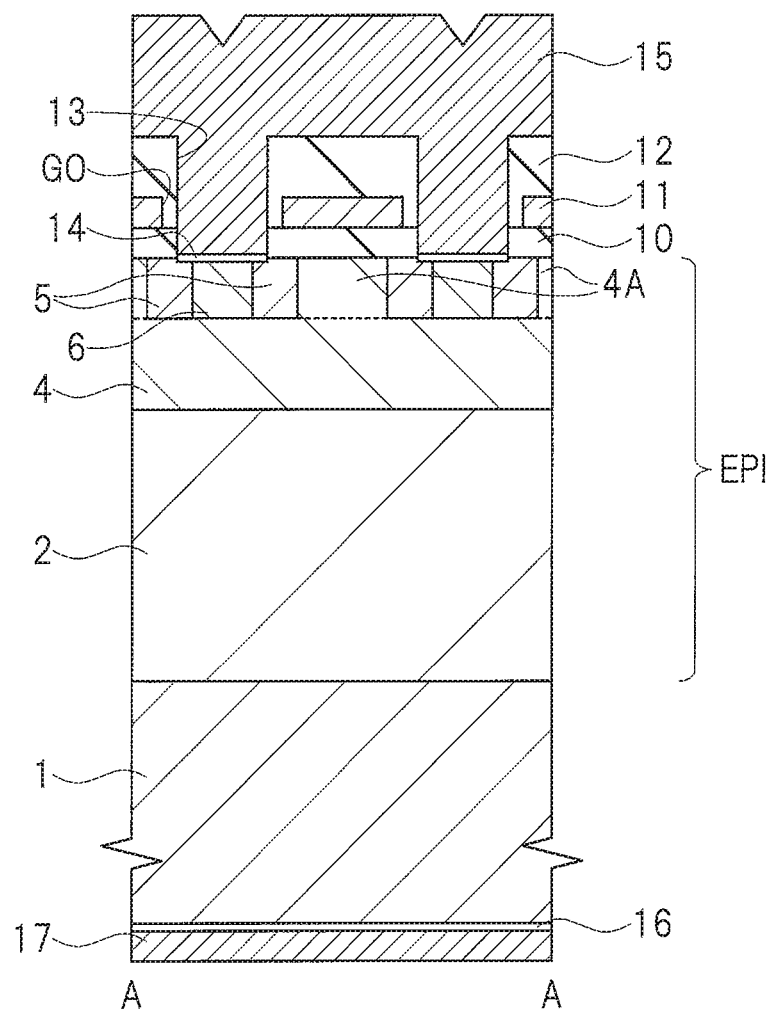
FIG. 11 is a cross-sectional view along line A-A on FIGS. 9 and 10.
Figure 12:
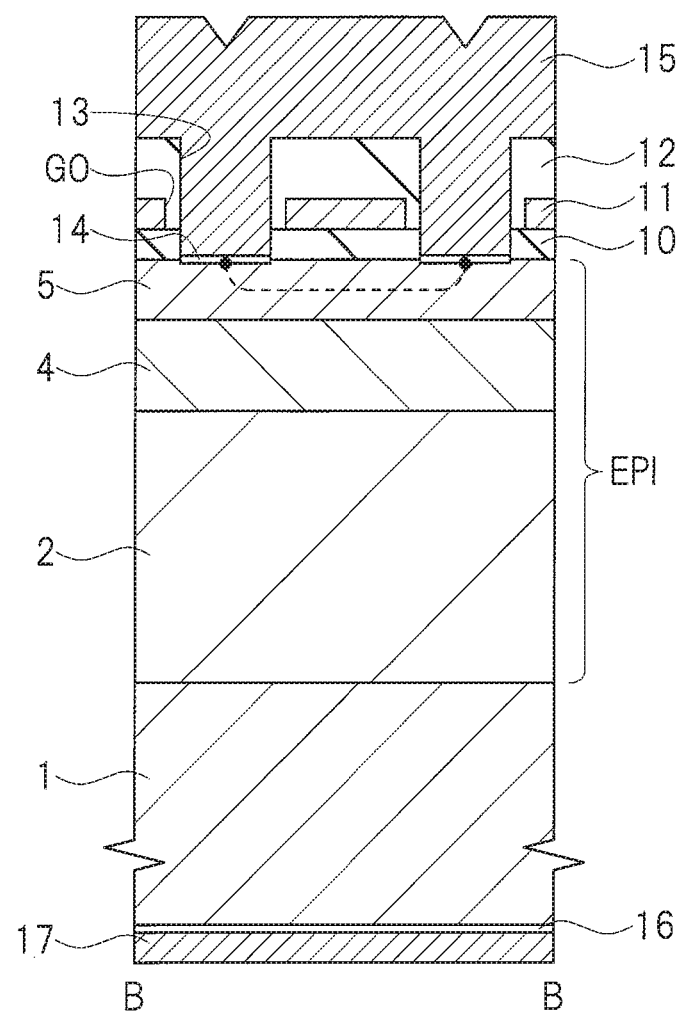
FIG. 12 is a cross-sectional view along line B-B on FIGS. 9 and 10.
Figure 13:
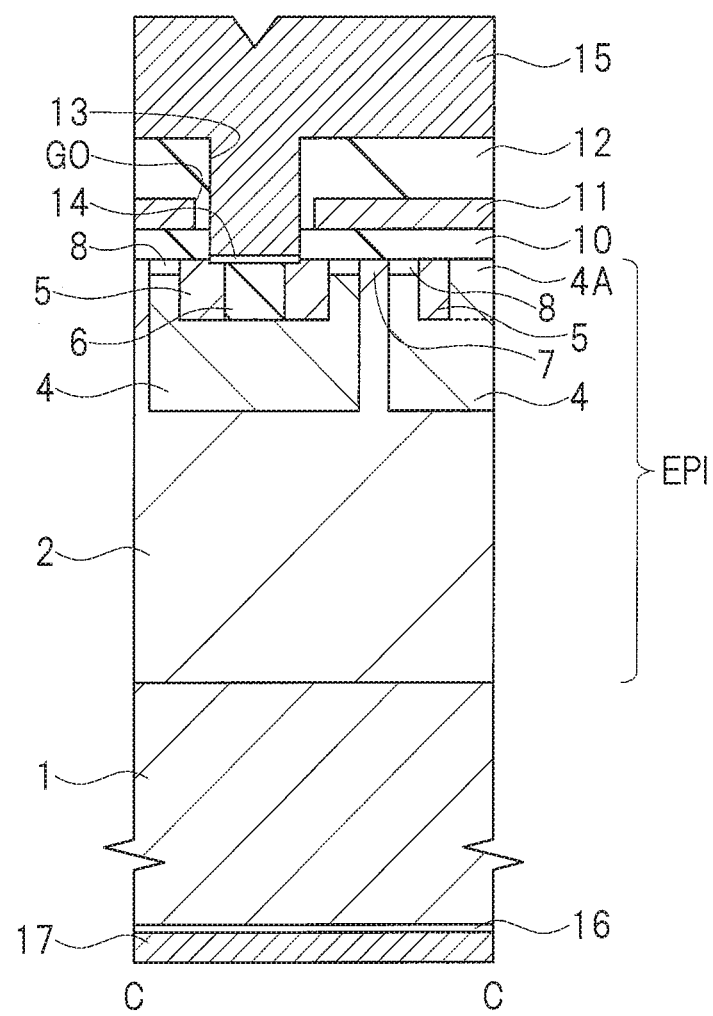
FIG. 13 is a cross-sectional view along line C-C on FIGS. 9 and 10.

A structure of a SiC-MOSFET according to a second embodiment is described with FIGS. 9 to 13. FIGS. 9 and 10 are principal part plan views depicting a portion of an element fabrication area in which a plurality of unit cells of the SiC-MOSFET according to the second embodiment are arrayed. FIG. 9 is a plan view of the SiC surface of the SiC-MOSFET and FIG. 10 is a plan view depicting a gate electrode and connection holes. FIG. 11 is a principal part cross-sectional view (a cross-sectional view along line A-A on FIGS. 9 and 10) of the SiC-MOSFET according to the second embodiment. FIG. 12 is a principal part cross-sectional view (a cross-sectional view along line B-B on FIGS. 9 and 10) of the SiC-MOSFET according to the second embodiment. FIG. 13 is a principal part cross-sectional view (a cross-sectional view along line C-C on FIGS. 9 and 10) of the SiC-MOSFET according to the second embodiment. The difference from the SiC-MOSFET according to the foregoing first embodiment is described here.

The difference from the SiC-MOSFET according to the foregoing first embodiment lies in that a p-type region 4A is formed between two connection holes 13 which are adjacent in the x direction such that it does not contact a $p^+$-type potential clamping region 6 on the SiC surface.

A p-type region 4A is formed in a depth direction from the upper surface of an n-type epitaxial layer EPI and formed to contact a p-type body region 4. A p-type region 4A has an impurity concentration that is equal or substantially equal to that of a p-type body region 4 and may be formed integrally with a p-type body region 4.

Further, for the SiC-MOSFET according to the second embodiment, again, two connection holes 13 which are adjacent in the x direction are in connection with each other via an $n^+$-type source region 5, as indicated by black circles and a dotted line in FIG. 12.

Consequently, a p-n junction area can be reduced and it is thus possible to suppress a current flowing through an $n^+$-type source region 5, a p-type body region 4, and an n-type drift layer 2 by a parasitic bipolar operation. As a result, a SiC-MOSFET and a power converter that are highly reliable can be realized.

Now, a p-type region 4A may be placed to contact a $p^+$-type potential clamping region 6 on the SiC surface. In this case, because a part of an $n^+$-type source region 5 needs to be electrically connected with the source wiring electrode 15 via a connection hole 13, an $n^+$-type source region 5 is formed such that a part of the $n^+$-type source region 5 is exposed from a connection hole 13 on one side or both sides, in the y direction, of a $p^+$-type potential clamping region 6 formed inside a connection hole 13.

Third Embodiment

Figure 14:
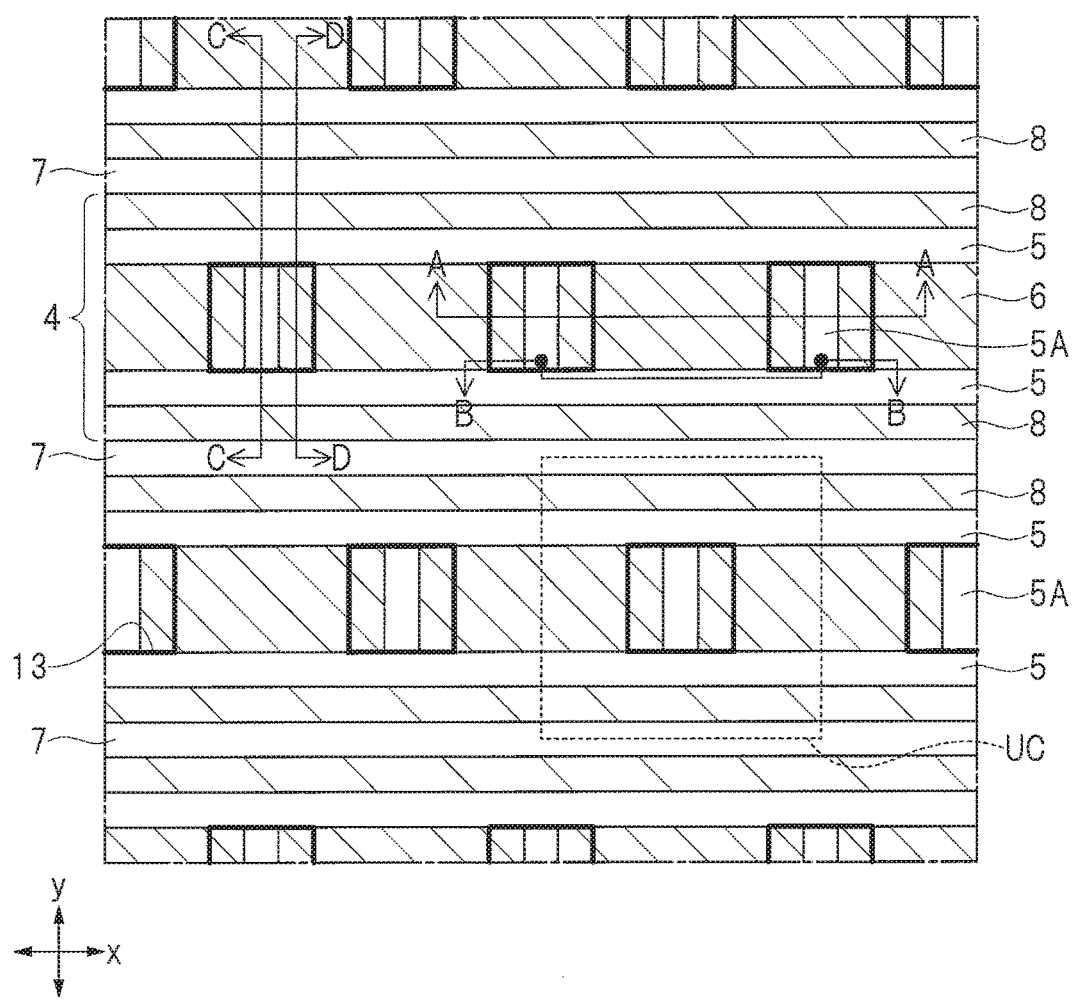
FIG. 14 is a principal part plan view depicting a portion of an element fabrication area in which a plurality of unit cells of a power semiconductor device according to a third embodiment are arrayed (a plan view of the SiC surface of a SiC-MOSFET).
Figure 15:
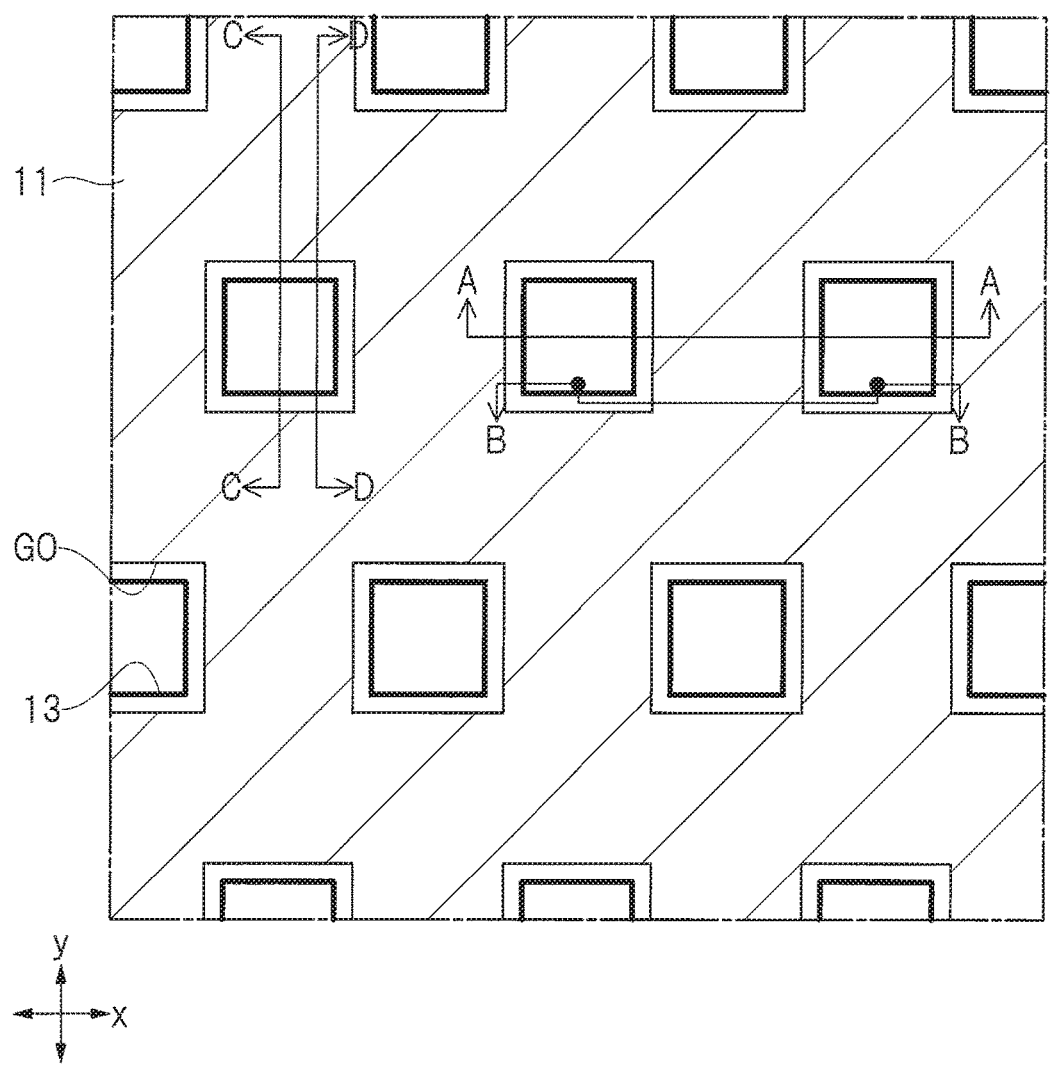
FIG. 15 is a principal part plan view depicting a portion of an element fabrication area in which a plurality of unit cells of the power semiconductor device according to the third embodiment are arrayed (a plan view depicting a gate electrode and connection holes in the SiC-MOSFET).
Figure 16:
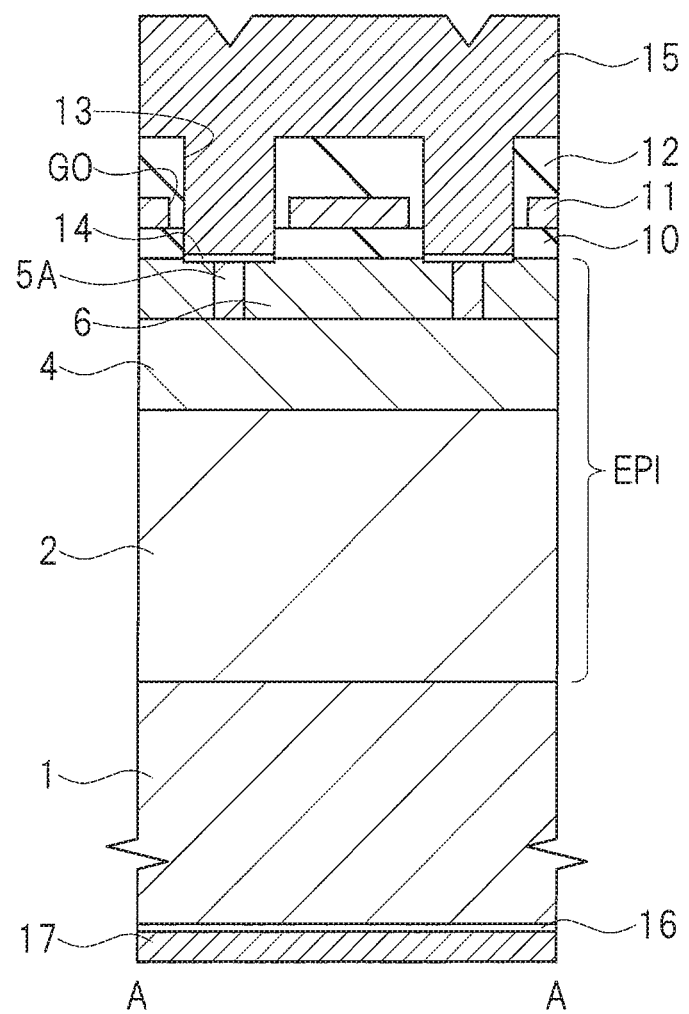
FIG. 16 is a cross-sectional view along line A-A on FIGS. 14 and 15.
Figure 17:
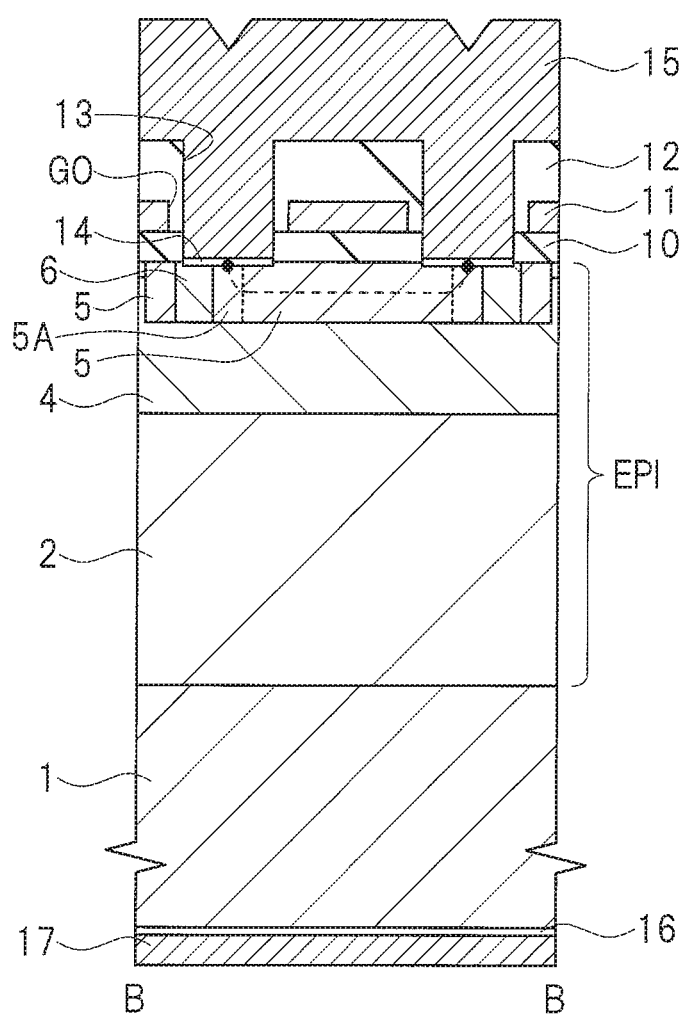
FIG. 17 is a cross-sectional view along line B-B on FIGS. 14 and 15.
Figure 18:
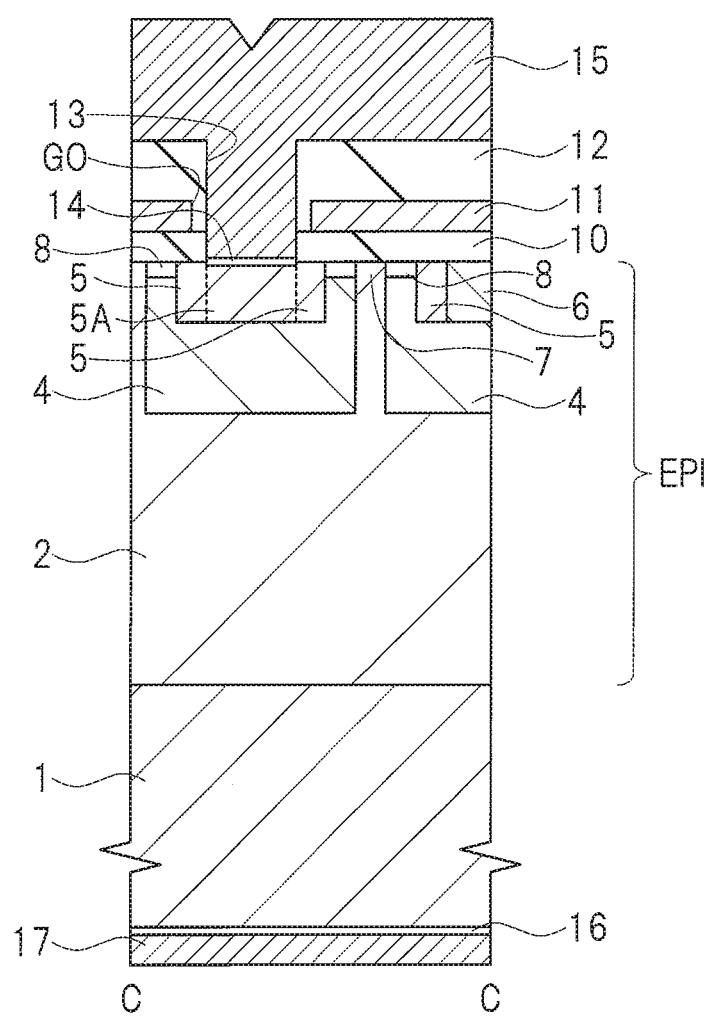
FIG. 18 is a cross-sectional view along line C-C on FIGS. 14 and 15.
Figure 19:
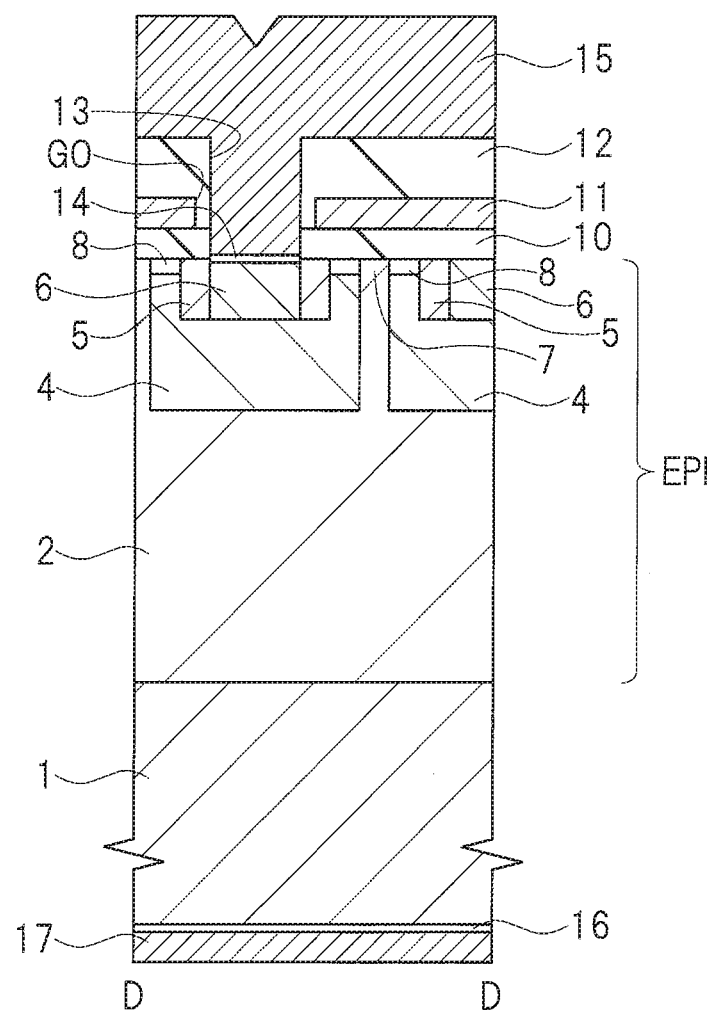
FIG. 19 is a cross-sectional view along line D-D on FIGS. 14 and 15.

A structure of a SiC-MOSFET according to a third embodiment is described with FIGS. 14 to 19. FIGS. 14 and 15 are principal part plan views depicting a portion of an element fabrication area in which a plurality of unit cells of the SiC-MOSFET according to the third embodiment are arrayed. FIG. 14 is a plan view of the SiC surface of the SiC-MOSFET and FIG. 15 is a plan view depicting a gate electrode and connection holes. FIG. 16 is a principal part cross-sectional view (a cross-sectional view along line A-A on FIGS. 14 and 15) of the SiC-MOSFET according to the third embodiment. FIG. 17 is a principal part cross-sectional view (a cross-sectional view along line B-B on FIGS. 14 and 15) of the SiC-MOSFET according to the third embodiment. FIG. 18 is a principal part cross-sectional view (a cross-sectional view along line C-C on FIGS. 14 and 15) of the SiC-MOSFET according to the third embodiment. FIG. 19 is a principal part cross-sectional view (a cross-sectional view along line D-D on FIGS. 14 and 15) of the SiC-MOSFET according to the third embodiment. The difference from the SiC-MOSFET according to the foregoing first embodiment is described here.

The difference from the SiC-MOSFET according to the foregoing first embodiment lies in that a $p^+$-type potential clamping region 6 is formed to extend between two holes 13 which are adjacent in the x direction. However, to avoid separating $n^+$-type source regions 5 positioned on both sides, in the y direction, of a $p^+$-type potential clamping region 6, an $n^+$-type source region 5A is formed to connect the $n^+$-type source regions 5 positioned on both sides, in the y direction, of the $p^+$-type potential clamping region 6. Further, to electrically connect an $n^+$-type source region 5A to the source wiring electrode 15, the n$^+$-type source region 5A is provided in a position that it is exposed from a connection hole 13.

An n$^+$-type source region 5A is formed in a depth direction from the upper surface of the n-type epitaxial layer EPI and formed to contact a p-type body region. An n$^+$-type source region 5A has an impurity concentration that is equal or substantially equal to that of an n$^+$-type source region 5 and may be formed integrally with an n$^+$-type source region 5.

Further, the width of a p$^+$-type potential clamping region 6 may be equal to the width of a connection hole 13 in the y direction in a planar view.

Further, for the SiC-MOSFET according to the third embodiment, again, two connection holes 13 which are adjacent in the x direction are in connection with each other via an n$^+$-type source region 5, as indicated by black circles and a dotted line in FIG. 17.

Consequently, a p-n junction area can be reduced and it is thus possible to suppress a current flowing through an n$^+$-type source region 5, a p-type body region 4, and an n-type drift layer 2 by a parasitic bipolar operation. As a result, a SiC-MOSFET and a power converter that are highly reliable can be realized.

Fourth Embodiment

Figure 20:
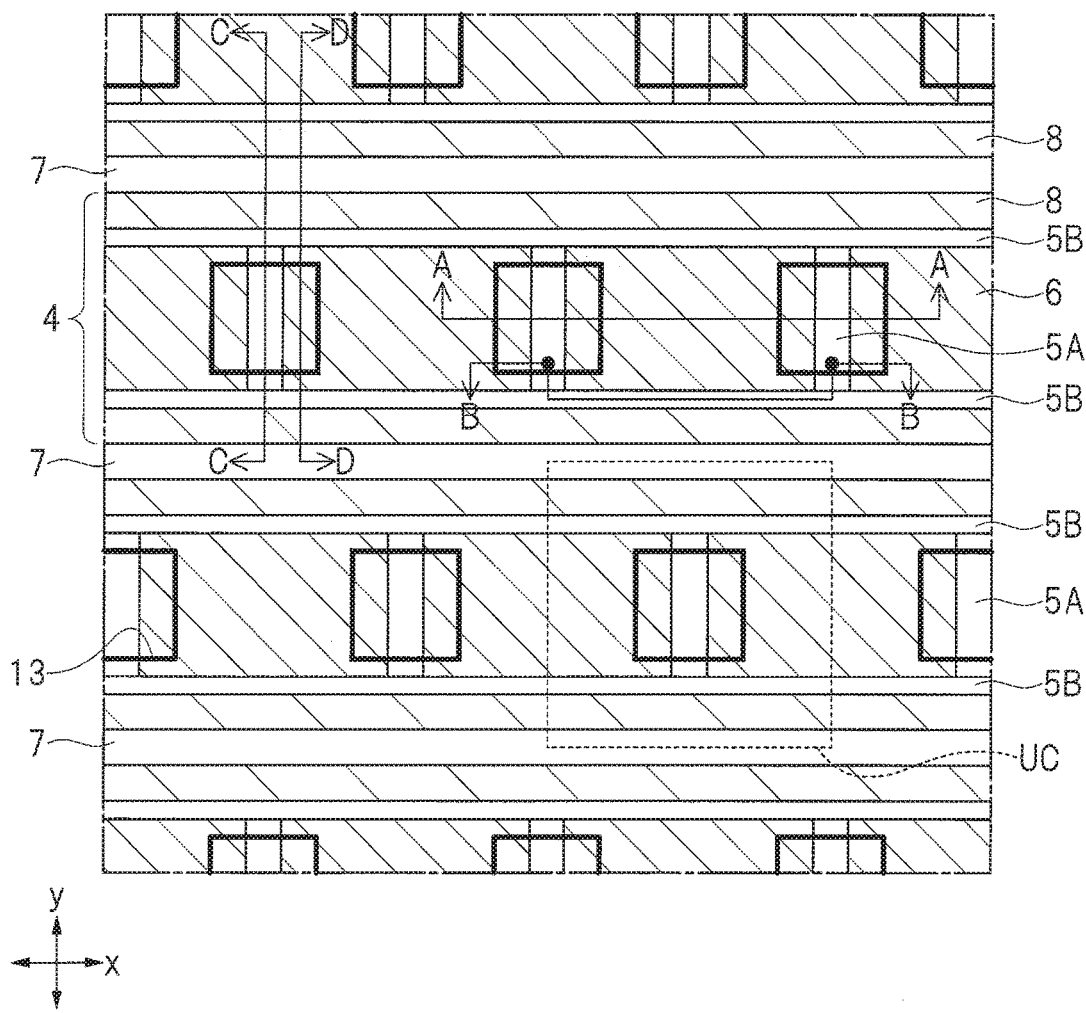
FIG. 20 is a principal part plan view depicting a portion of an element fabrication area in which a plurality of unit cells of a power semiconductor device according to a fourth embodiment are arrayed (a plan view of the SiC surface of a SiC-MOSFET).
Figure 21:
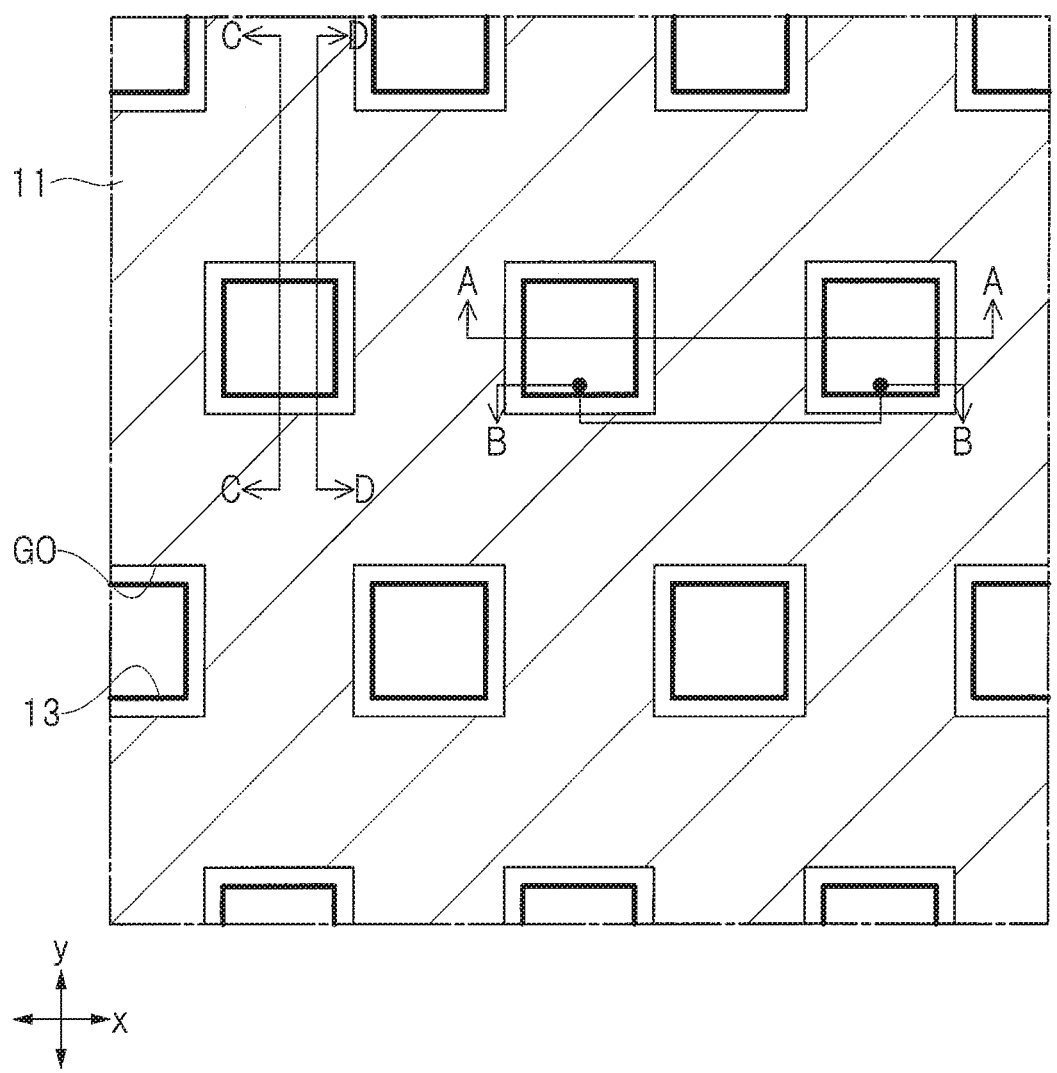
FIG. 21 is a principal part plan view depicting a portion of an element fabrication area in which a plurality of unit cells of the power semiconductor device according to the fourth embodiment are arrayed (a plan view depicting a gate electrode and connection holes in the SiC-MOSFET).
Figure 22:
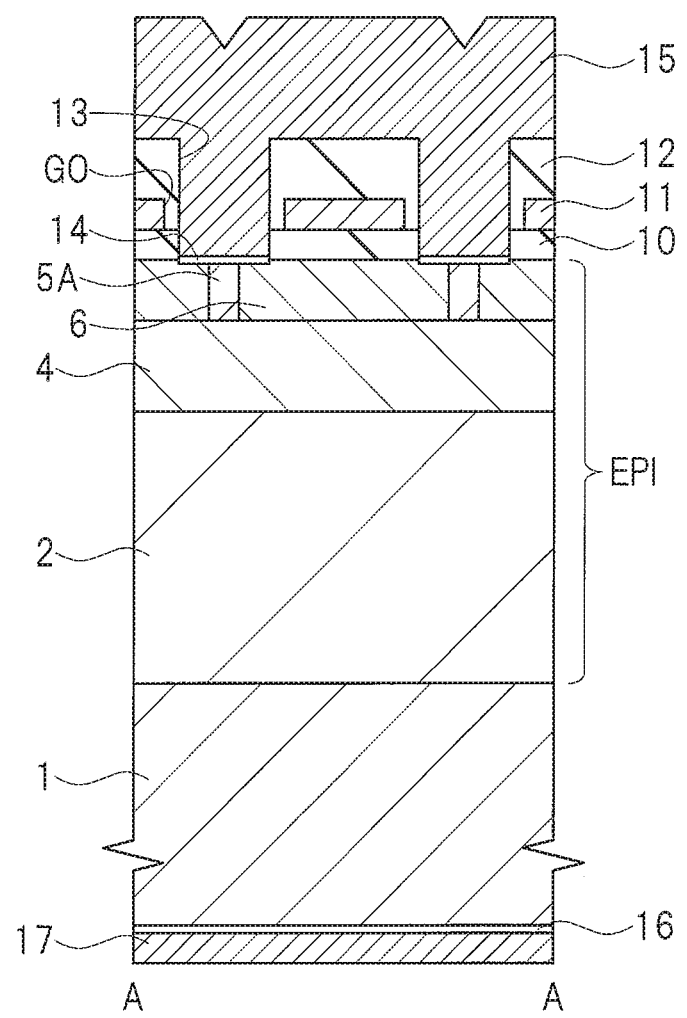
FIG. 22 is a cross-sectional view along line A-A on FIGS. 20 and 21.
Figure 23:
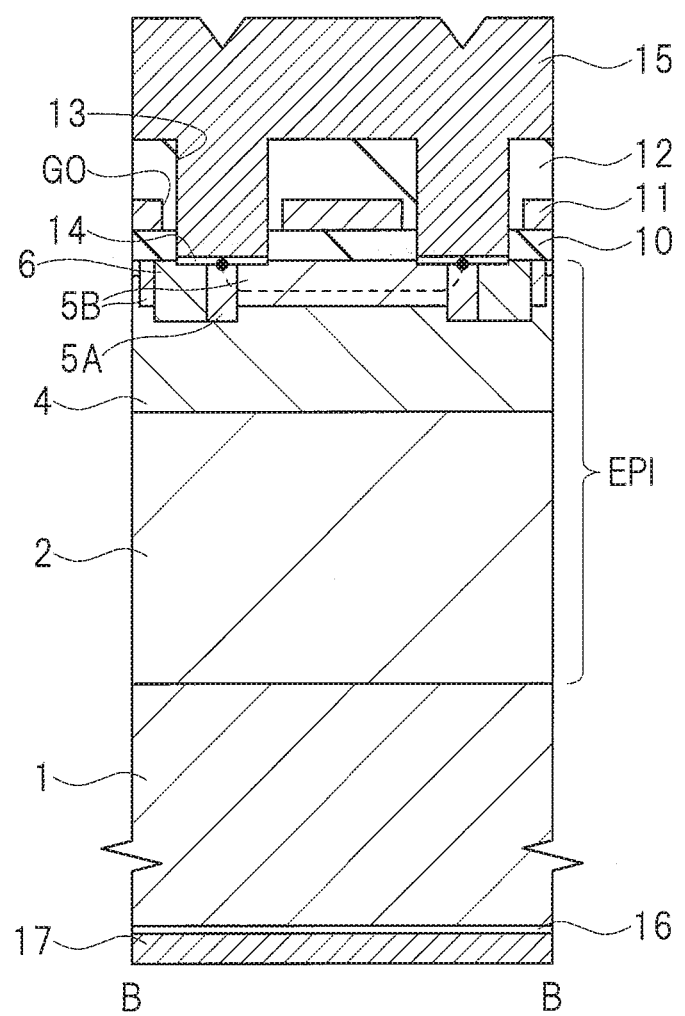
FIG. 23 is a cross-sectional view along line B-B on FIGS. 20 and 21.
Figure 24:
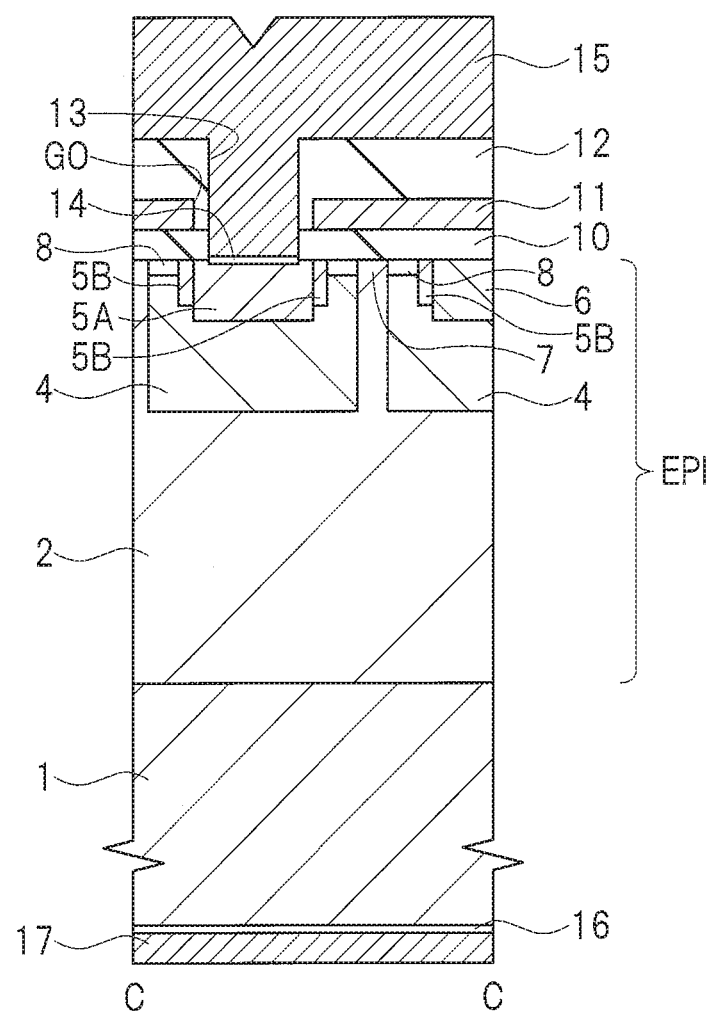
FIG. 24 is a cross-sectional view along line C-C on FIGS. 20 and 21.
Figure 25:
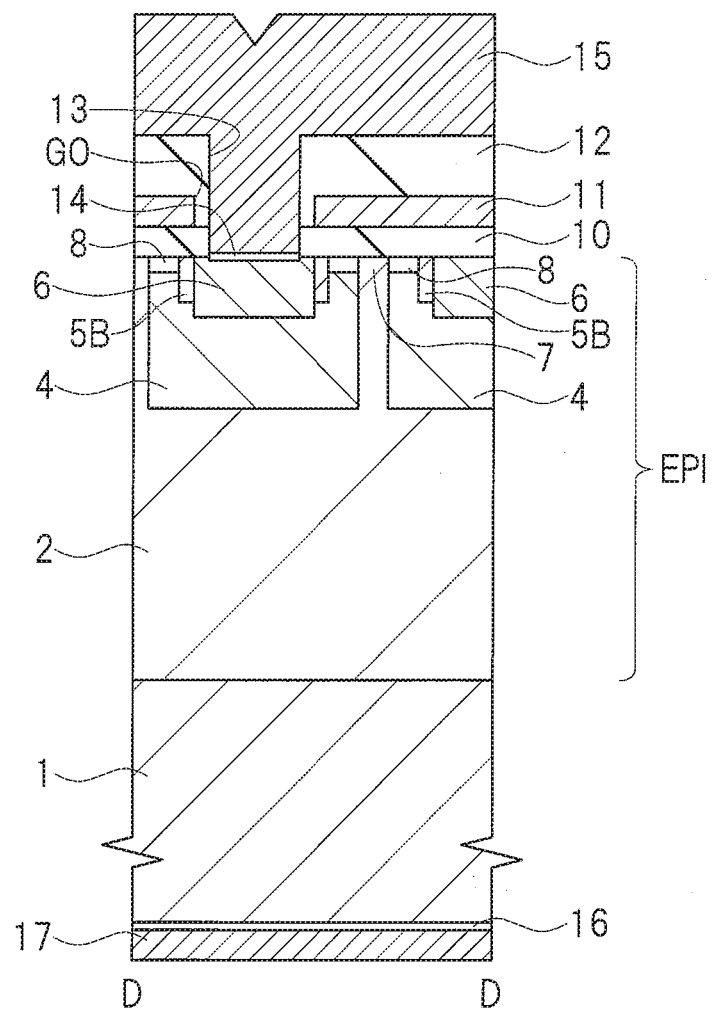
FIG. 25 is a cross-sectional view along line D-D on FIGS. 20 and 21.

A structure of a SiC-MOSFET according to a fourth embodiment is described with FIGS. 20 to 25. FIGS. 20 and 21 are principal part plan views depicting a portion of an element fabrication area in which a plurality of unit cells of the SiC-MOSFET according to the fourth embodiment are arrayed. FIG. 20 is a plan view of the SiC surface of the SiC-MOSFET and FIG. 21 is a plan view depicting a gate electrode and connection holes. FIG. 22 is a principal part cross-sectional view (a cross-sectional view along line A-A on FIGS. 20 and 21) of the SiC-MOSFET according to the fourth embodiment. FIG. 23 is a principal part cross-sectional view (a cross-sectional view along line B-B on FIGS. 20 and 21) of the SiC-MOSFET according to the fourth embodiment. FIG. 24 is a principal part cross-sectional view (a cross-sectional view along line C-C on FIGS. 20 and 21) of the SiC-MOSFET according to the fourth embodiment. FIG. 25 is a principal part cross-sectional view (a cross-sectional view along line D-D on FIGS. 20 and 21) of the SiC-MOSFET according to the fourth embodiment. The difference from the SiC-MOSFET according to the foregoing first embodiment is described here.

The difference from the SiC-MOSFET according to the foregoing first embodiment lies in that a p$^+$-type potential clamping region 6 is formed to extend between two holes 13 which are adjacent in the x direction. Further, n$^-$-type source regions 5B with a lower impurity concentration than n$^+$-type source regions 5, 5A, mentioned previously, are formed to elongate linearly, extending in the x direction and in parallel with a channel region 8, contacting the channel region. However, to avoid separating n$^-$-type source regions 5B positioned on both sides, in the y direction, of a p$^+$-type potential clamping region 6, an n$^+$-type source region 5A is formed to connect the n$^-$-type source regions 5B positioned on both sides, in the y direction, of the p$^+$-type potential clamping region 6. Further, to electrically connect an n$^+$-type source region 5A to the source wiring electrode 15, the n$^+$-type source region 5A is provided in a position that it is exposed from a connection hole 13. An n$^+$-type source region 5A is formed in a depth direction from the upper surface of the n-type epitaxial layer EPI and formed to contact a p-type body region 4.

Further, for the SiC-MOSFET according to the fourth embodiment, again, two connection holes 13 which are adjacent in the x direction are in connection with each other via an n$^+$-type source region 5A and an n$^-$-type source region 5B, as indicated by black circles and a dotted line in FIG. 23.

Consequently, a p-n junction area can be reduced and it is thus possible to suppress a current flowing through an n$^+$-type source region 5A, a p-type body region 4, and an n-type drift layer 2 by a parasitic bipolar operation.

By further providing n$^-$-type source regions 5B, it is possible to suppress damage to a gate insulator film 10 by an abrupt surge. If n$^-$-type source regions 5B are not provided, it is possible that a hot carrier produced in a p-n junction between a p-type body region and an n$^+$-type source region (see, inter alia, e.g., FIG. 20 for the third embodiment) causes a change in a threshold voltage or shortening the lifetime of a gate insulator film 10, among others. However, by providing n$^-$-type source regions 5B, it is possible to decrease a voltage applied to a p-n junction due to voltage drop when a surge occurs and also possible to decrease an electric field. As a result, a SiC-MOSFET and a power converter that are highly reliable can be realized.

While the present invention made by the present inventors has been described specifically based on its embodiments hereinbefore, it goes without saying that the present invention is not limited to the described embodiments and various modifications may be made thereto without departing from the gist of the present invention.

For example, the present invention is also applicable to a power semiconductor device having a SiC IGBT structure.

LIST OF REFERENCE SIGNS 1 n$^+$-type SiC substrate
2 n-type drift layer
4 p-type body region (well region)
4A p-type region
5 n$^+$-type source region
5A n$^+$-type source region
5B n$^-$-type source region
6 p$^+$-type potential clamping region
7 JFET region (doping region)
8 Channel region
10 Gate insulator film
11 Gate electrode
12 Interlayer insulator film
13 Connection hole
14 Metallic silicide layer
15 Source wiring electrode
16 Metallic silicide layer
17 Drain wiring electrode
21 Control circuit
22 Power module
23, 24, 25, 26, 27, 28, 29 Terminal
30 Three-phase motor
31 SiC-MOSFET
32 External backflow diode
33 Body diode
EPI n-type epitaxial layer
GO Opening
UC Unit cell

The invention claimed is:

1. A semiconductor device comprising:
   a substrate which is made of silicon carbide and has a first conductivity type;
   an epitaxial layer which is made of silicon carbide and has the first conductivity type, formed on a principal surface of the substrate;
   a plurality of body regions having a second conductivity type different from the first conductivity type, formed to extend in a first direction within the epitaxial layer from an upper surface of the epitaxial layer and separate from each other in a second direction orthogonal to the first direction;
   a JFET region having the first conductivity type, formed to extend in the first direction between the body regions which are adjacent to each other in the second direction,
   a source region having the first conductivity type, formed to extend in the first direction within the body regions from the upper surface of the epitaxial layer and separate from an end side surface of each of the body regions in the second direction;
   a channel region formed to extend in the first direction and in a top layer portion of each of the body regions between an end side surface of each of the body regions in the second direction and an end side surface of the source region in the second direction;
   a gate insulator film formed to contact the channel region;
   a gate electrode formed to contact the gate insulator film;
   an interlayer insulator film formed over the upper surface of the epitaxial layer to cover the gate electrode;
   a plurality of connection holes formed in the interlayer insulator film, positioned within the body regions to separate from each other in the first direction in a planar view; and
   a potential clamping region having the second conductivity type, formed from the upper surface of the epitaxial layer within each of the body regions,
   wherein the potential clamping region is formed inside the first connection hole and inside the second connection hole in a planar view, and
   wherein the bottom surfaces of a first connection hole and a second connection hole which are adjacent to each other in the first direction are in connection with each other by the source region.

2. The semiconductor device according to claim 1, wherein the gate electrode is formed between the first connection hole and the second connection hole in a planar view.

3. The semiconductor device according to claim 1, wherein the potential clamping region and the gate electrode do not overlap in a planar view.

4. The semiconductor device according to claim 1, further comprising:
   a first region having the second conductivity type, formed from the upper surface of the epitaxial layer within each of the body regions,
   wherein the first region is formed between the first connection hold and the second connection hole in a planar view.

5. The semiconductor device according to claim 4, wherein the first region has an impurity concentration that is equal to the impurity concentration of the body regions.

6. The semiconductor device according to claim 5, wherein the source region is comprised of a first source region and a second source region,
   the first region extends in the first direction to contact the channel region and the second source region is exposed on the bottom surface of each of the plurality of connection holes.

7. The semiconductor device according to claim 6, wherein the first source regions, each formed on both sides, in the second direction, of the plurality of connection holes, are in connection with each other by the second source region.

8. The semiconductor device according to claim 4, wherein the first region has an impurity concentration that is equal to the impurity concentration of the potential clamping region and the first region is in connection with the potential clamping region in the first direction.

9. The semiconductor device according to claim 8, wherein the source region is comprised of a first source region and a second source region,
   the first region extends in the first direction to contact the channel region and the second source region is exposed on the bottom surface of each of the plurality of connection holes.

10. The semiconductor device according to claim 9, wherein the first source regions, each formed on both sides, in the second direction, of the plurality of connection holes, are in connection with each other by the second source region.

11. The semiconductor device according to claim 9, wherein the second source region has an impurity concentration that is higher than the impurity concentration of the first source region.

12. A power converter comprising the semiconductor device according to claim 1.

* * * * *